US012733283B2

(12) United States Patent
Kim et al.

(10) Patent No.: US 12,733,283 B2
(45) Date of Patent: Sep. 8, 2026

(54) IMAGE SENSORS HAVING SHARED PIXELS WITH DEEP TRENCH ISOLATIONS THEREBETWEEN OVERLAPPED BY CONTACT BARRIER STRUCTURES

(71) Applicant: Samsung Electronics Co., Ltd., Suwon-si (KR)

(72) Inventors: Junghye Kim, Suwon-si (KR); Gilwoo Kong, Suwon-si (KR); Donghyun Kim, Suwon-si (KR); Sungin Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 278 days.

(21) Appl. No.: 18/410,884

(22) Filed: Jan. 11, 2024

(65) Prior Publication Data

US 2024/0243151 A1 Jul. 18, 2024

(30) Foreign Application Priority Data

Jan. 13, 2023 (KR) ........................ 10-2023-0005531

(51) Int. Cl.
*H10F 39/00* (2025.01)
*H04N 25/77* (2023.01)

(52) U.S. Cl.
CPC ......... *H10F 39/807* (2025.01); *H10F 39/802* (2025.01); *H10F 39/8023* (2025.01);
(Continued)

(58) Field of Classification Search
CPC .... H10F 39/813; H10F 39/807; H10F 39/014; H10F 39/186–1865;
(Continued)

(56) References Cited

U.S. PATENT DOCUMENTS 8,704,330 B2 4/2014 Yoshihisa et al.
9,165,959 B2 10/2015 Chen et al.
(Continued)

FOREIGN PATENT DOCUMENTS

KR 100761824 B1 9/2007
KR 10-2017-0084734 A 7/2017
(Continued)

*Primary Examiner* — Younes Boulghassoul
(74) *Attorney, Agent, or Firm* — Wolf, Greenfield & Sacks, P.C.

(57) ABSTRACT

An image sensor includes a substrate and first and second shared pixels, which extend adjacent to each other in a first direction across the substrate. Each of the shared pixels includes: a plurality of floating diffusion regions at spaced apart locations within the substrate, and a plurality of spaced-apart source follower gates electrically connected to the plurality of floating diffusion regions. A deep trench isolation structure is provided, which extends within the substrate and at least partially partitions the first and second shared pixels from each other. A contact barrier structure is provided, which extends on the substrate, vertically overlaps the deep trench isolation structure, at least partially partitions the first and second shared pixels from each other, and is arranged with a long axis in a second direction orthogonal to the first direction and between the source follower gate of the first shared pixel and the source follower gate of the second shared pixel.

20 Claims, 19 Drawing Sheets

(52) U.S. Cl.
CPC ... *H10F 39/8037* (2025.01); *H10F 39/80373* (2025.01); *H10F 39/811* (2025.01); *H10F 39/813* (2025.01); *H04N 25/77* (2023.01); *H10F 39/8033* (2025.01)

(58) Field of Classification Search
CPC ..... H10F 39/802–80377; H10F 39/111; H04N 25/778; H04N 25/615
See application file for complete search history.

(56) References Cited

U.S. PATENT DOCUMENTS 10,313,616 B2 6/2019 Jung et al.
10,840,279 B2 11/2020 Kwag
11,075,238 B2 7/2021 Cheng et al.
11,195,871 B2 * 12/2021 Kwag ................. H10F 39/8037
11,233,086 B2 1/2022 Chen
2018/0098008 A1 4/2018 Mao et al.
2020/0119082 A1 * 4/2020 Lee ....................... H10F 39/153
2020/0219925 A1 * 7/2020 Jang ...................... H10F 39/813
2021/0125642 A1 4/2021 Mariani et al.
2021/0242257 A1 * 8/2021 Lee ........................ H10F 39/802
2021/0358980 A1 * 11/2021 Oh ........................ H10F 39/153
2022/0052103 A1 2/2022 Zang et al.
2022/0271077 A1 8/2022 Lee et al.
2022/0367536 A1 11/2022 Saka et al.
2023/0054728 A1 * 2/2023 Park ...................... H10F 39/802
2023/0144373 A1 * 5/2023 Kim .................... H10F 39/8053 348/302
2023/0352510 A1 * 11/2023 Kim ...................... H10F 39/807
2024/0038815 A1 * 2/2024 Yamashita .......... H10F 39/8023
2024/0120351 A1 * 4/2024 Kim ...................... H10F 39/802
2024/0186354 A1 * 6/2024 Masagaki ............. H10F 39/807
2024/0243142 A1 * 7/2024 Moon ................. H10F 39/8037
2025/0169219 A1 * 5/2025 Kim ..................... H10D 89/611
2025/0280619 A1 * 9/2025 Fujiyama ............... H04N 25/70

FOREIGN PATENT DOCUMENTS

KR 10-2020-0138522 A 12/2020
KR 20220023996 A 3/2022

* cited by examiner

IMAGE SENSORS HAVING SHARED PIXELS WITH DEEP TRENCH ISOLATIONS THEREBETWEEN OVERLAPPED BY CONTACT BARRIER STRUCTURES

REFERENCE TO PRIORITY APPLICATION

This application is based on and claims priority under 35 U.S.C. § 119 to Korean Patent Application No. 10-2023-0005531, filed Jan. 13, 2023, the disclosure of which is hereby incorporated herein by reference.

BACKGROUND

The inventive concept relates to image sensors and, more particularly, to image sensors having highly integrated pixels therein.

An image sensor is a device that converts an optical image signal into an electrical signal. An image sensor can have a plurality of pixels, and each pixel can include a photodiode that receives incident light and converts the light into an electrical signal. A pixel circuit is also provided, which outputs a pixel signal based on electrical charges generated by the photodiode. Recently, as the degree of integration of image sensors increases, the size of each pixel is reduced. In order to increase the effective area of a photodiode as miniaturization of a pixel size progresses, a shared pixel structure may be used in which a plurality of pixels share transistors.

SUMMARY

The inventive concept provides an image sensor that uses a contact barrier structure for suppressing capacitive coupling between source follower gates of adjacent shared pixels, and thereby improves the electrical characteristics of the image sensor.

According to an aspect of the inventive concept, an image sensor is provided, which includes a substrate, and a plurality of shared pixels. The plurality of shared pixels include a plurality of unit pixels, a deep trench isolation structure, which partitions the plurality of shared pixels, and a contact barrier structure that is arranged between the plurality of shared pixels and overlaps the deep trench isolation structure in a vertical direction. Each of first and second shared pixels may be arranged adjacent to each other in a first horizontal direction, and respectively include a plurality of floating diffusion regions arranged at different locations from each other, and a plurality of source follower gates electrically connected to the plurality of floating diffusion regions and arranged at different locations from each other. The contact barrier structure may be arranged with a long axis in a second horizontal direction perpendicular to the first horizontal direction, between the source follower gate of the first shared pixel and the source follower gate of the second shared pixel.

According to another aspect of the inventive concept, an image sensor is provided, which includes a plurality of shared pixels. Each of the shared pixels includes first and second floating diffusion regions, first and second source follower gates, and a selection gate. In addition, a deep trench isolation structure is provided, which partitions the plurality of shared pixels, and a contact barrier structure is provided, which is arranged between the plurality of shared pixels and overlaps the deep trench isolation structure in a vertical direction. Each shared pixel includes a plurality of unit pixels, and in each shared pixel, the first and second source follower gates are arranged at one end in the first horizontal direction and face each other in a second horizontal direction perpendicular to the first horizontal direction. The selection gate may be arranged at the other end in the first horizontal direction, and may face the first source follower gate in the first horizontal direction. An output voltage line may be provided, which is arranged at one end of the selection gate.

According to another aspect of the inventive concept, an image sensor is provided that includes a substrate and a plurality of shared pixels. Each of the plurality of shared pixels includes: a first sub-pixel including four first unit pixels sharing a first floating diffusion region, a second sub-pixel including four second unit pixels sharing a second floating diffusion region, first to third source follower gates, and first and second transfer gates, which are arranged on the substrate and respectively correspond to the first and second unit pixels. A deep trench isolation structure is provided, which is arranged on the substrate and partitions the plurality of shared pixels. First and second shared pixels may be arranged adjacent to each other in a first horizontal direction, and a contact barrier structure, which has a long axis in a second horizontal direction perpendicular to the first horizontal direction, may be arranged between the plurality of shared pixels and may also overlap the deep trench isolation structure in a vertical direction. According to some embodiments, in each of the first and second shared pixels, the first and second source follower gates face each other in the first horizontal direction, and are arranged at both ends in the first horizontal direction. The first and third source follower gates may face each other in the second horizontal direction and may be arranged at one end in the first horizontal direction.

BRIEF DESCRIPTION OF THE DRAWINGS

Embodiments will be more clearly understood from the following detailed description taken in conjunction with the accompanying drawings in which:

FIG. 3A is a plan layout view of shared pixels of an image sensor, according to an embodiment, corresponding to the circuit diagram of FIG. 2;

DETAILED DESCRIPTION OF THE EMBODIMENTS

Hereinafter, embodiments of the inventive concept will be described in detail with reference to the attached drawings.

Figure 1:
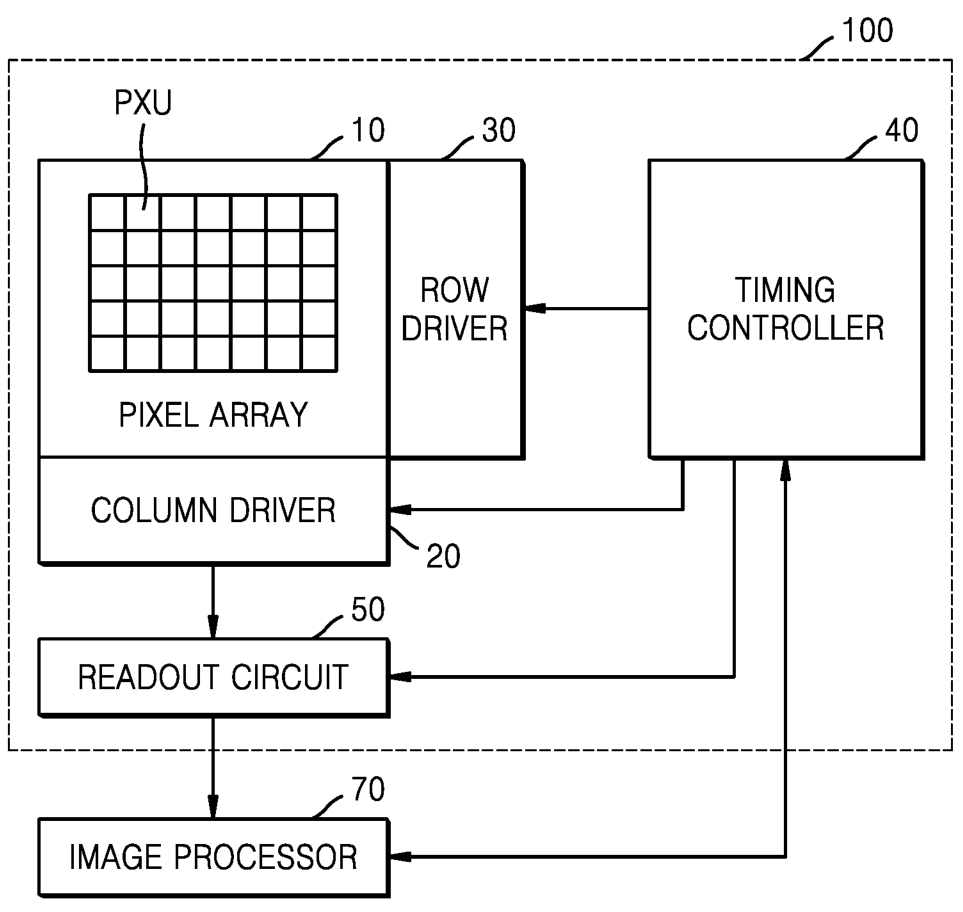
FIG. 1 is a block diagram for describing an image sensor according to an embodiment.

FIG. 1 is a block diagram that illustrates an image sensor 100 according to an embodiment, which includes a pixel array 10 and a plurality of circuits for controlling the pixel array 10. In some embodiments, circuits for controlling the pixel array 10 may include a column driver 20, a row driver 30, a timing controller 40, and a readout circuit 50, connected as shown. The image sensor 100 may operate according to a control command received from an image processor 70, convert light transmitted from an external object into electrical signals, and output the electrical signals to the image processor 70. The image sensor 100 may be configured as a complementary metal oxide semiconductor (CMOS) image sensor, in some embodiments.

The pixel array 10 may include a plurality of pixel units PXU having a two-dimensional array structure arranged in a matrix form along a plurality of row lines and a plurality of column lines. In the present specification, a row refers to a set of a plurality of unit pixels arranged in a horizontal direction among a plurality of unit pixels included in the pixel array 34, and a column refers to a set of a plurality of unit pixels arranged in a vertical direction among the plurality of unit pixels included in the pixel array 34.

Each of the plurality of pixel units PXU may have a multi-pixel structure including a plurality of photodiodes. In each of the plurality of pixel units PXU, a plurality of photodiodes may generate charges by receiving light transmitted from an object. The image sensor 100 may perform an auto-focus function by using a phase difference between pixel signals generated from the plurality of photodiodes included in each of the plurality of pixel units PXU. Each of the plurality of pixel units PXU may include a pixel circuit for generating a pixel signal from charges generated by the plurality of photodiodes.

The column driver 20 may include a correlated double sampler (CDS), an analog-to-digital (ADC) converter, and the like. The correlated double sampler may be connected to a pixel unit PXU included in a row selected by a row selection signal supplied by the row driver 30, through column lines, and may perform correlated double sampling to determine a reset voltage and a pixel voltage. The analog-to-digital converter may convert the reset voltage and the pixel voltage detected by the correlated double sampler, into digital signals, and transmit the digital signals to the readout circuit 50.

The readout circuit 50 may include a latch or buffer circuit for temporarily storing a digital signal and an amplification circuit, and may temporarily store or amplify the digital signal received from the column driver 20 to obtain image data. Operation timings of the column driver 20, the row driver 30, and the readout circuit 50 may be determined by the timing controller 40, and the timing controller 40 may operate by a control command transmitted by the image processor 70. The image processor 70 may signal-process image data output from the readout circuit 50 and output the image data to a display device or store the image data in a storage device such as a memory. When the image sensor 100 is mounted in an autonomous vehicle, the image processor 70 may signal-process image data and transmit the image data to a main controller that controls the autonomous vehicle.

Figure 2:
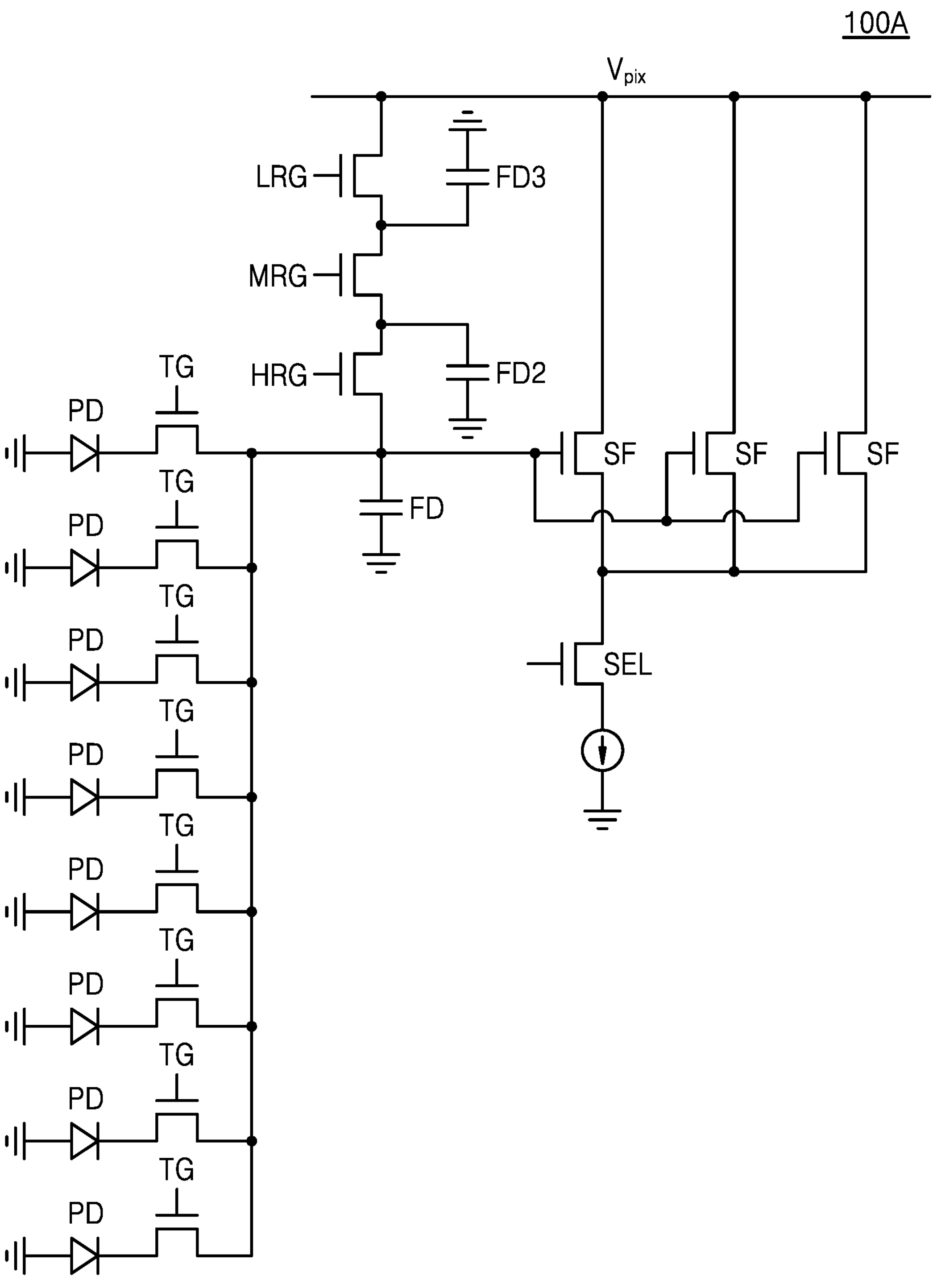
FIG. 2 is a circuit diagram of an example of a pixel unit included in an image sensor, according to an embodiment.
Figure 3A:
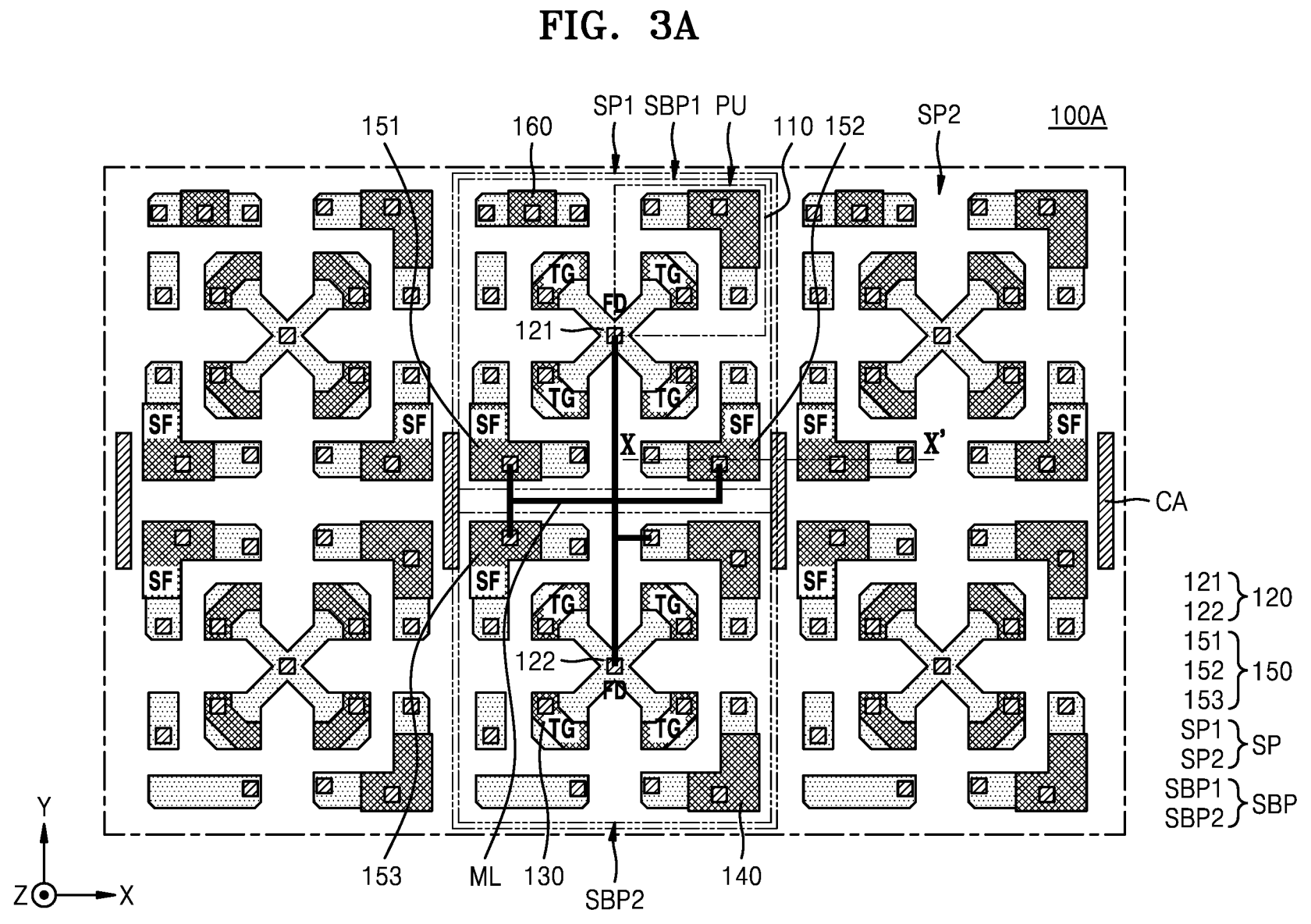
Figure 3B:
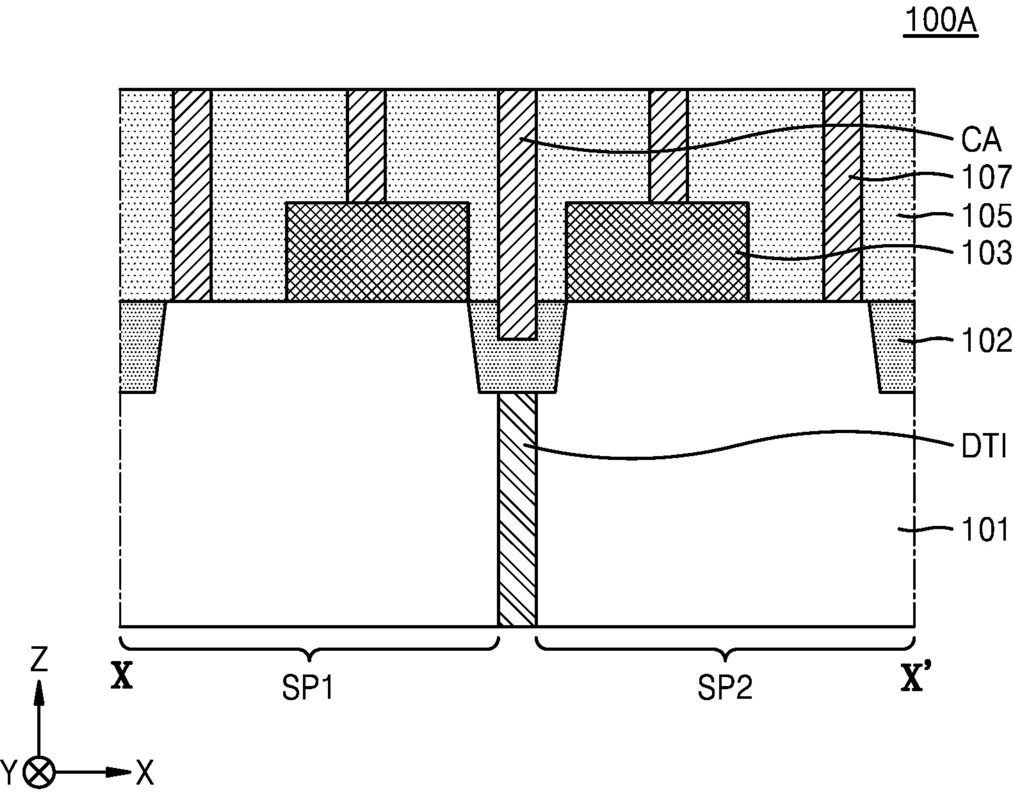
FIG. 3B is a cross-sectional view taken along line X-X' of FIG. 3A.

FIG. 2 is an electrical circuit diagram of an example of a pixel unit included in an image sensor, according to an embodiment; FIG. 3A is a plan layout of shared pixels of an image sensor, according to an embodiment, corresponding to the circuit diagram of FIG. 2; and FIG. 3B is a cross-sectional view taken along line X-X' of FIG. 3A. Referring together with FIGS. 2 to 3B, an image sensor 100A according to the present embodiment may include a plurality of shared pixels SP arranged on a substrate 101 in a two-dimensional array structure.

Each shared pixel SP may include a plurality of unit pixels PU. In some embodiments, the shared pixel SP may include a photodiode 110, a floating diffusion region 120, a transfer transistor 130, various types of pixel transistors 140, 150, and 160, and a metal wiring layer ML.

Each shared pixel SP may be isolated from each other through a deep trench isolation structure DTI. In some embodiments, the deep trench isolation structure DTI may be a front-side deep trench isolation structure. The front-side deep trench isolation structure may be formed inside the substrate 101 in a vertical direction (Z direction) from the front side of the substrate 101. In addition, a plurality of photodiodes 110 may be arranged in each shared pixel SP. In the circuit diagram, eight photodiodes 110 arranged in one shared pixel SP are illustrated, but the inventive concept is not limited thereto.

The shared pixel SP may have a rectangular shape overall, and may include a region corresponding to one color filter (not shown). In other words, a single color filter (not shown) may be arranged on all of the photodiodes 110 constituting the shared pixel SP. Accordingly, light of a same wavelength range may be incident on all photodiodes 110 of the shared pixel SP. The shared pixel SP may include a plurality of sub-pixels SBP. A sub-pixel SBP may refer to a pixel that is within a range covered by one micro-lens (not shown). The sub-pixel SBP may include one unit pixel PU or a plurality of unit pixels PU.

In the image sensor 100A according to the present embodiment, each shared pixel SP may include two sub-pixels SBP, and each sub-pixel SBP may include four unit pixels PU. Thus, each shared pixel SP may include eight unit pixels PU. However, a number of sub-pixels SBP included in one shared pixel SP and a number of unit pixels PU included in one sub-pixel SBP are not limited thereto. The unit pixel PU may be a concept that includes the photodiode 110, the floating diffusion region 120, and the transfer transistor 130. Also, in a vertical form, the transfer transistor 130 and various types of pixel transistors 140, 150, and 160 may be arranged on a surface of the substrate 101, and the photodiode 110 may be arranged below the surface of the substrate 101, for example, below the transfer transistor 130 and the various types of pixel transistors 140, 150, and 160. In some embodiments, the transfer transistor 130 may have a vertical gate structure and be connected to the photodiode 110.

Each floating diffusion region 120 may be arranged at a central portion of each of the first and second sub-pixels SBP1 and SBP2. The floating diffusion regions 120 arranged at different locations may also be shared by all photodiodes 110 of the shared pixel SP through a metal wiring layer ML. Accordingly, charges generated by all photodiodes 110 of the shared pixel SP may be stored together in the floating diffusion region 120 and used as an image signal.

Moreover, regarding a planar shape of the floating diffusion region 120, each floating diffusion region 120 may have a shape surrounded by a deep trench isolation structure DTI, which divides unit pixels PU from each other. In addition, the floating diffusion regions 120 may be in contact with each other in a silicon (Si) region of the substrate 101 where the deep trench isolation structure DTI, which divides the four unit pixels PU within each of the first and second sub-pixels SBP1 and SBP2, is not formed, and may have a shape obliquely extending to each unit pixel PU.

The shared pixel SP of the image sensor 100A of the present embodiment may be used while switching between a high-pixel mode and a high-sensitivity mode. Here, the high-pixel mode refers to a mode in which light-sensing signals of each unit pixel PU or each of the first and second sub-pixels SBP1 and SBP2 are independently used, and the high-sensitivity mode refers to a mode in which light-sensing signals of the unit pixels PU constituting the shared pixel SP are merged and used.

In other words, during the high-pixel mode, charges generated in the photodiode 110 of each of the unit pixels PU, or each of the sub-pixels SBP in the shared pixel SP, may pass through the floating diffusion region 120 and be used as respective image signals. In contrast, during the high-sensitivity mode, all charges generated from the photodiodes 110 of the unit pixel PU in the shared pixel SP may be accumulated together in the floating diffusion region 120, and the entire charges may be used as a single image signal.

The transfer transistor 130 may be arranged in each unit pixel PU in the shared pixel SP. For example, since the shared pixel SP includes eight unit pixels PU, eight transfer transistors 130 may be arranged in the shared pixel SP, as also shown by the electrical schematic of FIG. 2. The transfer transistor 130 (with transfer gate TG) may transfer charges generated by the corresponding photodiode 110 to the floating diffusion region 120. In the drawing, a transfer gate TG of the transfer transistor 130 is shown, and the transfer gate TG, the photodiode 110 corresponding thereto, and the floating diffusion region 120 corresponding thereto may form the transfer transistor 130.

The shared pixel SP may include various types of pixel transistors 140, 150, and 160 for transferring signals corresponding to charges stored in the floating diffusion region 120. The various types of pixel transistors 140, 150, and 160 may include, for example, a reset transistor 140, a source follower transistor 150, and a selection transistor 160. For example, a source follower gate SF of the source follower transistor 150 is illustrated in the drawing. The source follower gate SF and heavily doped regions formed on both sides of the source follower gate SF may constitute the source follower transistor 150. Details of the source follower transistor 150 will be described later.

In some embodiments, the reset transistor 140 may include a low reset gate LRG, a middle reset gate MRG, and a high reset gate HRG, as also shown by the electrical schematic of FIG. 2. According to the operation of the reset transistor 140, additional floating diffusion regions FD2 and FD3 may be opened to store more charges.

In some embodiments, a conversion gain transistor (not shown) may be further included in the shared pixel SP. The conversion gain transistor may be used to implement dual conversion gain or triple conversion gain of the shared pixel SP. Here, the conversion gain may refer to a rate at which charges that are generated by the photodiode 110 and transferred to the floating diffusion region 120 and accumulated are converted into a voltage signal.

In the image sensor 100A according to the present embodiment, each floating diffusion region 120 included in the shared pixel SP may be connected to the source follower gate SF of the source follower transistor 150 via the metal wiring layer ML. This connection relationship may be understood through a circuit diagram. For reference, the metal wiring layer ML may be electrically connected to a corresponding component through a vertical contact 107.

In the image sensor 100A of the present embodiment, a contact barrier structure CA arranged between the plurality of shared pixels SP and overlapping the deep trench isolation structure DTI in the vertical direction (Z direction) may be included. Among the plurality of shared pixels SP, shared pixels SP arranged adjacent to each other along a first horizontal direction (X direction) are referred to as first and second shared pixels SP1 and SP2 for convenience of description. That is, in the drawing, a shared pixel SP located in a center is referred to as the first shared pixel SP1, and a shared pixel SP located to the right side of the first shared pixel SP1 is referred to as the second shared pixel SP2.

In detail, the first and second shared pixels SP1 and SP2 may include first and second floating diffusion regions 121 and 122 arranged at different positions, respectively. In addition, the first and second shared pixels SP1 and SP2 may include first to third source follower transistors 151, 152, 153 that are electrically connected to the plurality of floating diffusion regions 121 and 122 and arranged at different positions from one another. That is, in order to implement a fine pixel structure efficiently, a design in which a plurality of source follower transistors 150 are arranged in several portions may be provided.

In some embodiments, the first and second source follower transistors 151 and 152 may be located in the first sub-pixel SBP1, and the third source follower transistor 153 may be located in the second sub-pixel SBP2. For example, the first and second source follower transistors 151 and 152 may face each other in the first horizontal direction (X direction) and be arranged at both ends in the first horizontal direction (X direction), and the first and third source follower transistors 151 and 153 may face each other in a second horizontal direction (Y direction) and be arranged at one ends in the first horizontal direction (X direction).

When viewed from a plan perspective, the contact barrier structure CA may be arranged with a long axis in the second horizontal direction (Y direction), in a region where the second source follower transistor 152 of the first shared pixel SP1 and the first and third source follower transistors 151 and 153 of the second shared pixel SP2 face each other. And, when viewed in cross-section, the contact barrier structure CA may overlap the deep trench isolation structure DTI in the vertical direction (Z direction), but be spaced apart from each other. A lower insulating layer 102, which is an insulation material layer, may be arranged between the contact barrier structure CA and the deep trench isolation structure DTI. Here, the contact barrier structure CA may penetrate into a portion of the lower insulating layer 102. That is, a vertical level of a bottom surface of the contact barrier structure CA may be lower than a vertical level of a bottom surface of the gate structure 103 constituting the source follower transistor 150. Each of the first to third source follower transistors 151, 152, and 153 may include the vertical contact 107 electrically connected thereto, and the vertical contact 107 may be surrounded by an upper insulating layer 105.

The contact barrier structure CA may include, for example, a conductive metal material such as copper (Cu), aluminum (Al), or tungsten (W). In some embodiments, the vertical contact 107 may include a conductive metal material such as copper (Cu), aluminum (Al), or tungsten (W), which can be the same material as that of the contact barrier structure CA. As will be described later, the contact barrier structure CA and the vertical contact 107 may include substantially the same material and be formed in substantially the same process. The contact barrier structure CA including a conductive metal material as described above may be electrically connected to a DC voltage line (not shown). Accordingly, the contact barrier structure CA may suppress coupling between neighboring source follower gates SF.

Recently, as the degree of integration of image sensors increases, the size of each pixel is becoming smaller. Thus, in order to increase the area of a photodiode in a pixel with decreasing size, currently, a shared pixel structure is used, in which a plurality of pixels share transistors. In a typical image sensor, parasitic capacitance may occur due to coupling between source follower gates included in shared pixels adjacent to each other. This causes undesirable deterioration of electrical characteristics. In order to suppress the occurrence of such parasitic capacitance, it is desirable to design a distance between source follower gates in neighboring shared pixels as large as possible, but in a fine pixel structure, the degree of freedom of source follower gates is considerably limited.

Thus, in order to solve the problem of parasitic capacitance, in the image sensor 100A of the present embodiment, the contact barrier structure CA may be formed between the source follower gates SF and a voltage may be applied, thereby significantly reducing parasitic capacitance. That is, parasitic capacitance between the source follower gates SF may be substantially eliminated by arranging the contact barrier structure CA, to which a voltage is applied, between adjacent shared pixels SP, such that the contact barrier structure CA overlaps the deep trench isolation structure DTI in the vertical direction (Z direction). Ultimately, as the image sensor 100A according to the inventive concept includes the contact barrier structure CA whereby coupling between the source follower gates SF of adjacent shared pixels SP is prevented, electrical characteristics of the image sensor 100A may be improved.

FIGS. 4 to 7 are cross-sectional views illustrating a method of manufacturing an image sensor, according to an embodiment. However, when an embodiment is implementable differently, a specific process order may be performed differently from the described one. For example, two processes described in succession may be performed substantially simultaneously, or may be performed in an order reverse to the order described.

Figure 4:
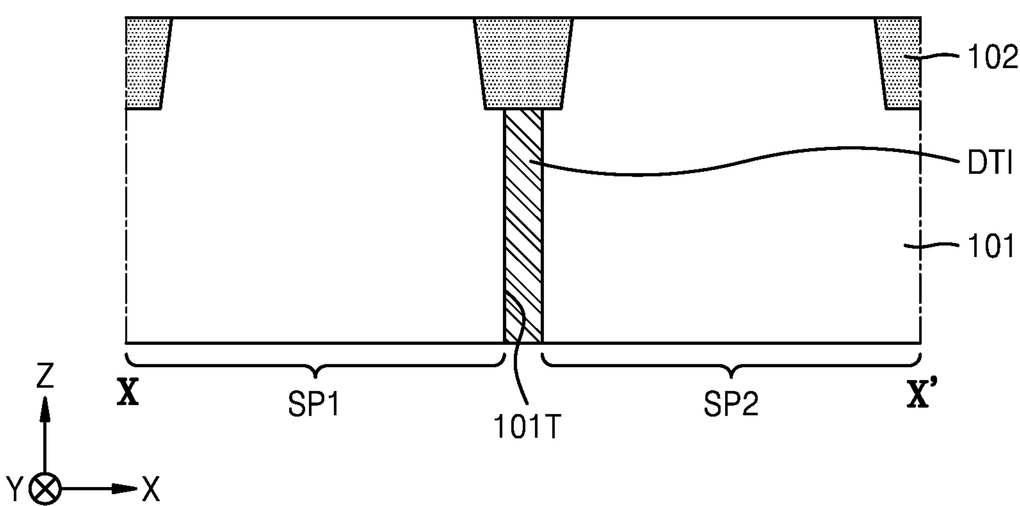
FIGS. 4 to 7 are cross-sectional views of a method of manufacturing an image sensor, according to an embodiment.

Referring to FIG. 4, a first trench 101T may be formed by removing a portion of the substrate 101. Next, an insulating barrier and a conductive filling film may be sequentially formed in the first trench 101T, and portions of the insulating barrier and the conductive filling film arranged on the substrate 101 may be removed through a planarization process to thereby form a deep trench isolation structure DTI in the first trench 101T. Next, another portion of the substrate 101 may be removed to form the lower insulating layer 102. A portion of the lower insulating layer 102 may be formed to contact the deep trench isolation structure DTI. The lower insulating layer 102 may include, for example, silicon oxide, silicon nitride, silicon oxynitride, or a combination thereof.

Figure 5:
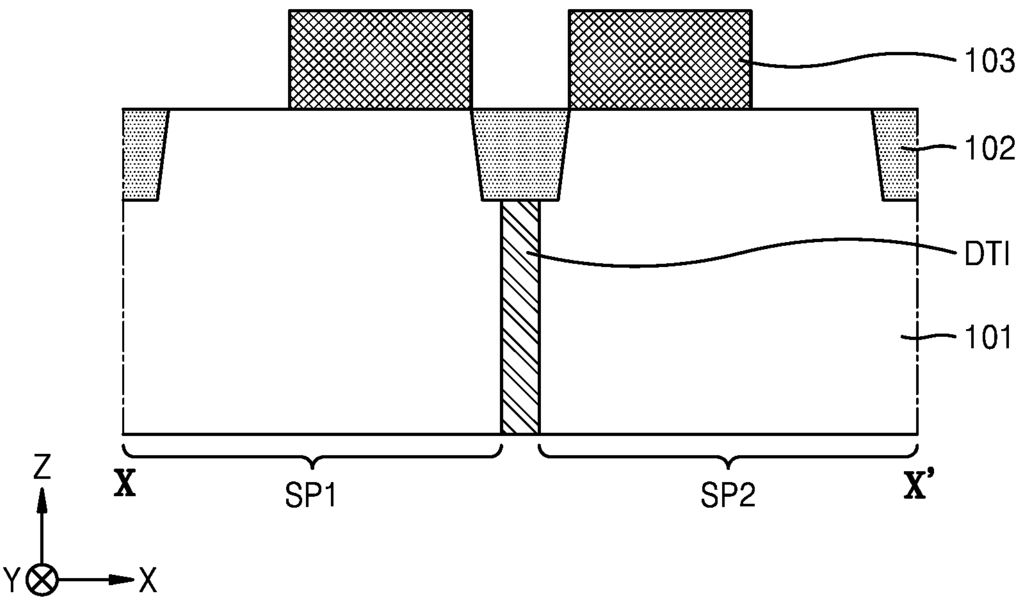

Referring to FIG. 5, a gate structure 103 constituting the source follower transistor 150 (see FIG. 3A) may be formed on the substrate 101. The gate structure 103 may be arranged to be spaced apart from each other with the lower insulating layer 102 and the deep trench isolation structure DTI therebetween. The gate structure 103 may include doped polysilicon, but is not limited thereto.

Figure 6:
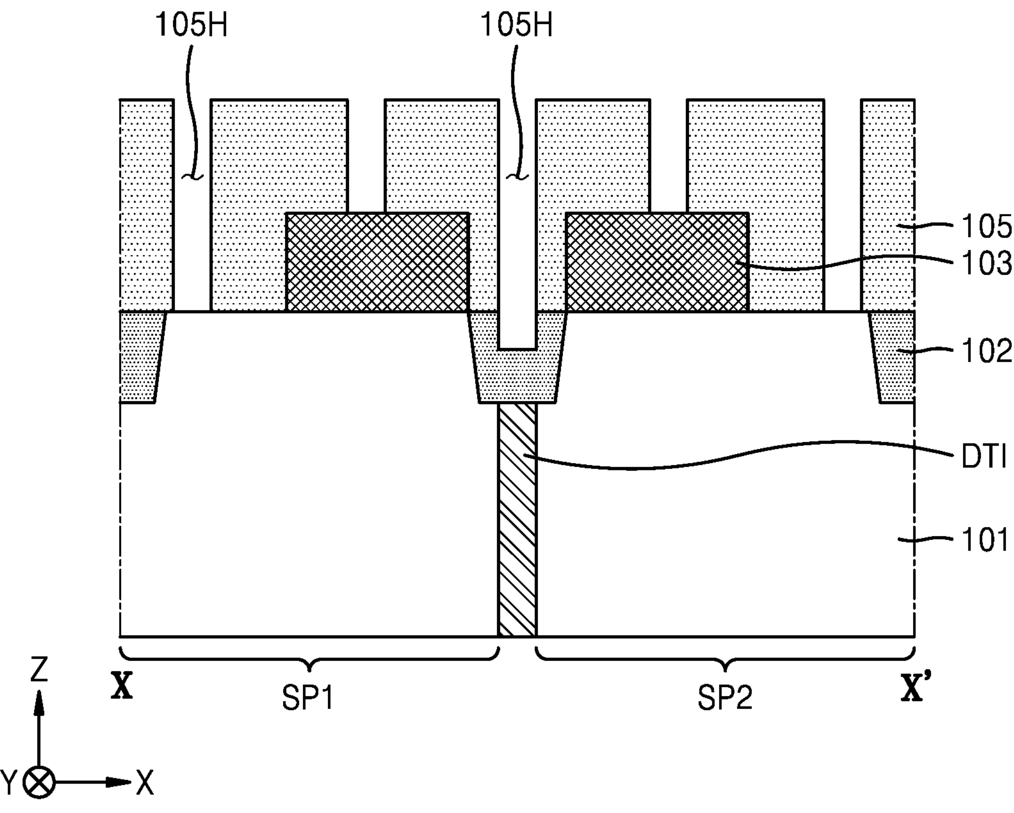

Referring to FIG. 6, the upper insulating layer 105 may be formed on the substrate 101 to surround the gate structure 103. The upper insulating layer 105 may include, for example, silicon oxide, silicon nitride, silicon oxynitride, or a combination thereof. Next, a contact hole 105H exposing an upper surface of the substrate 101 and an upper surface of the gate structure 103 may be formed using a photo process and an etching process. In detail, after forming a mask pattern (not shown) covering a portion of the upper insulating layer 105 excluding a region where the contact hole 105H is to be formed, and then using the mask pattern as an etching mask, a portion of the upper insulating layer 105 may be etched to form the contact hole 105H.

Figure 7:
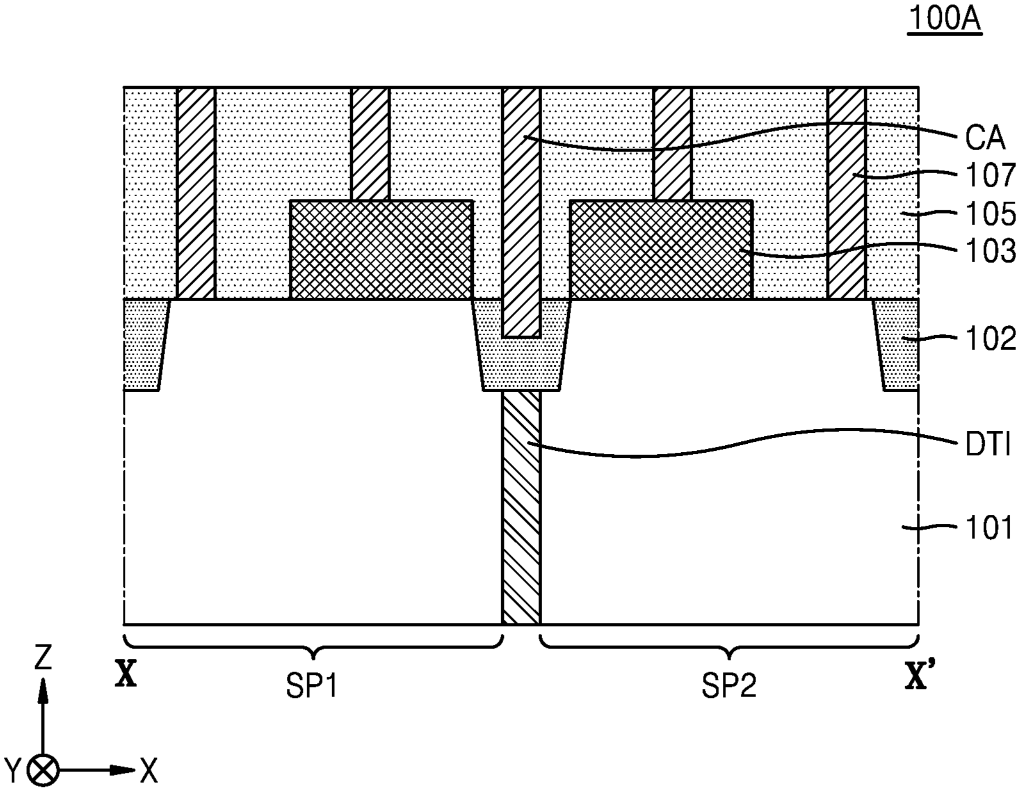

Referring to FIG. 7, a conductive barrier layer (not shown) covering an inner wall of the contact hole 105H (see FIG. 6) may be formed, and a conductive material may be filled in the conductive barrier layer to form a plurality of vertical contacts 107. Here, some of the plurality of vertical contacts 107 may constitute the contact barrier structure CA. That is, the contact barrier structure CA and the vertical contact 107 may include substantially the same material and be formed in substantially the same process, in some embodiments. Although not shown, next, an interlayer insulating layer and a conductive line layer may be formed on the upper surface of the upper insulating layer 105 and the vertical contact 107.

By using the manufacturing process described above, in the image sensor 100A according to the inventive concept, the contact barrier structure CA whereby coupling between gate structures 103 of neighboring shared pixels SP may be suppressed may be formed using an existing manufacturing process without any additional process.

FIGS. 8A to 9B are diagrams of shared pixels of an image sensor, according to another embodiment, corresponding to the circuit diagram of FIG. 2. Most components constituting image sensors 100B and 100C described below and materials constituting the components are substantially the same as or similar to those described above with reference to FIGS. 2 to 3B. Thus, for convenience of explanation, the description will focus on differences from the image sensor 100A described above.

Figure 8A:
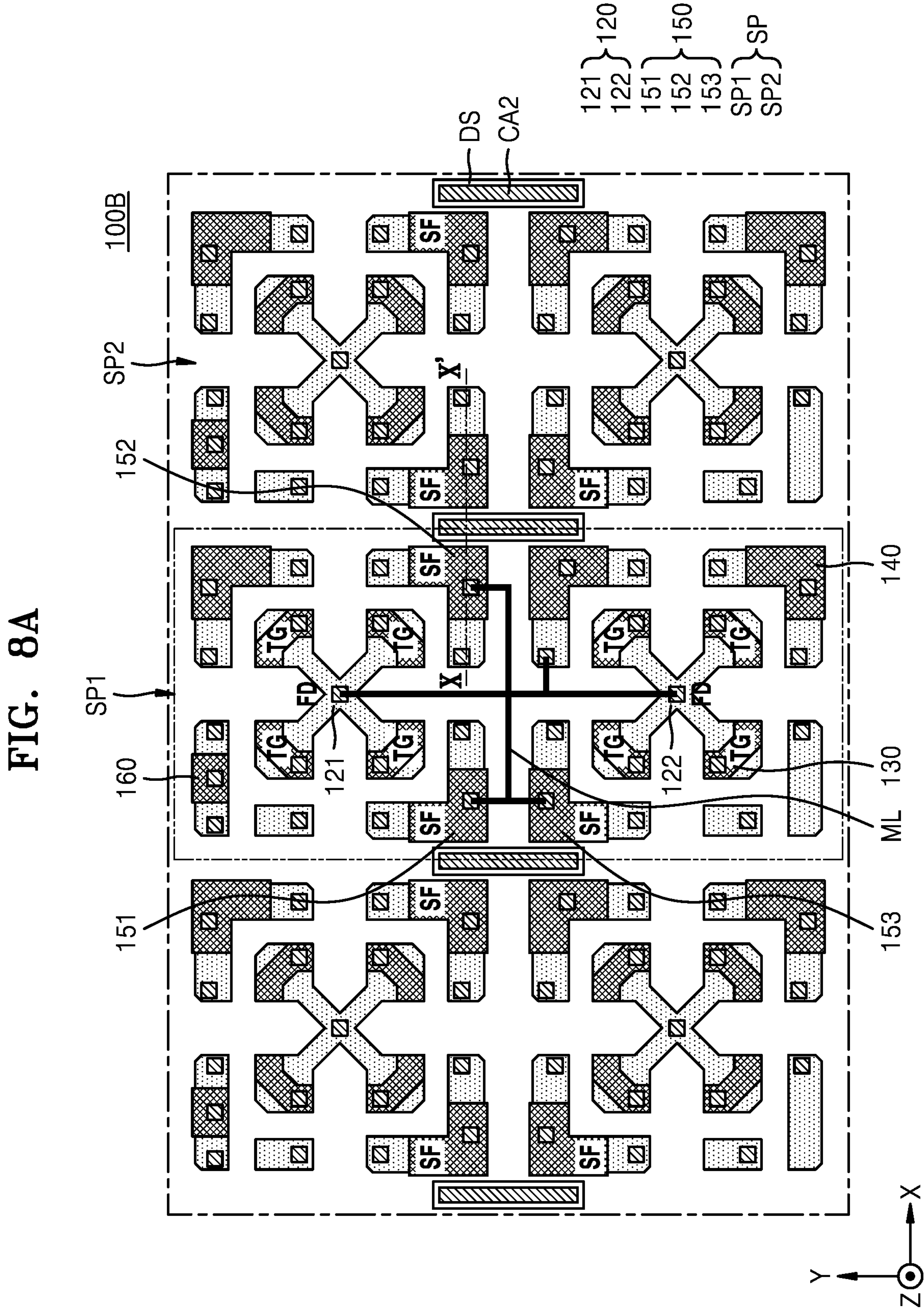
FIGS. 8A to 9B are diagrams of shared pixels of an image sensor, according to another embodiment, corresponding to the circuit diagram of FIG. 2.
Figure 8B:
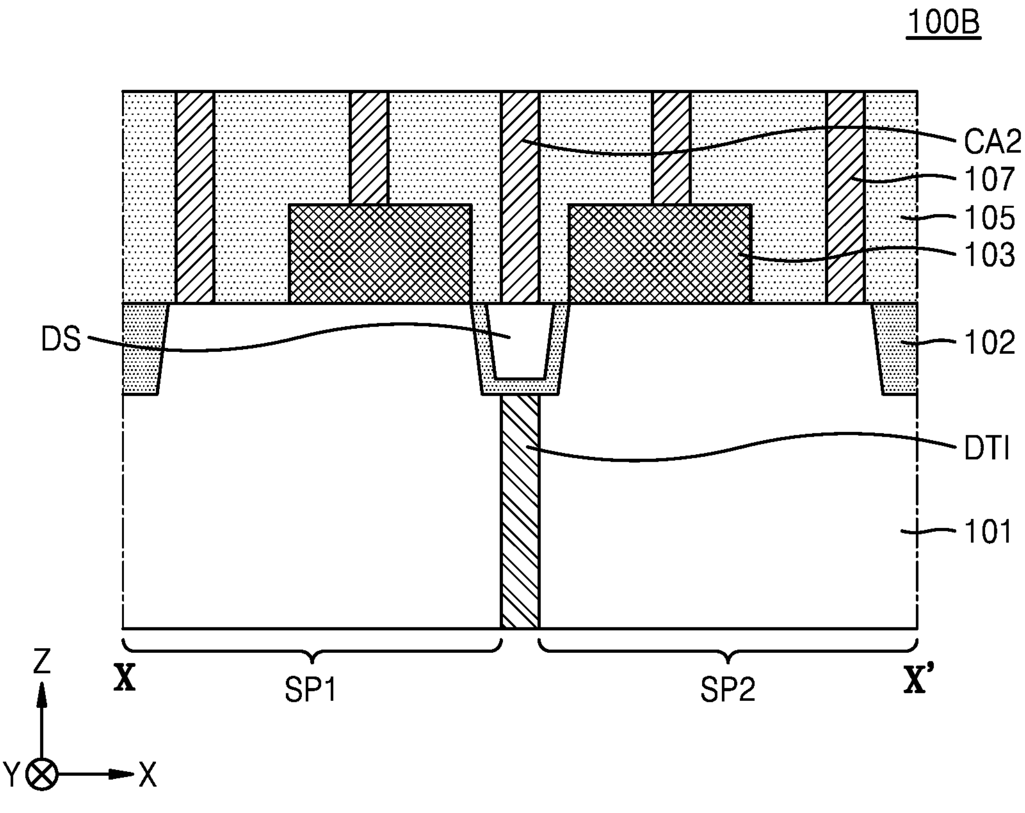

Referring to FIGS. 8A and 8B together, the image sensor 100B according to the present embodiment may include a plurality of shared pixels SP arranged on the substrate 101 in a two-dimensional array structure. The image sensor 100B of the present embodiment may include a contact barrier structure CA2 arranged between the plurality of shared pixels SP and overlapping the deep trench isolation structure DTI in the vertical direction (Z direction).

When viewed from a plan perspective, the contact barrier structure CA2 may be arranged with a long axis in the second horizontal direction (Y direction), in a region where the second source follower transistor 152 of the first shared pixel SP1 and the first and third source follower transistors 151 and 153 of the second shared pixel SP2 face each other.

When viewed in cross-section, the contact barrier structure CA2 may overlap the deep trench isolation structure DTI in the vertical direction (Z direction), but a silicon dummy structure DS may be arranged therebetween. In some embodiments, the silicon dummy structure DS may be a portion of a material constituting the substrate 101. That is, the lower insulating layer 102 and the silicon dummy structure DS, which include different materials from each other, may be arranged between the contact barrier structure CA2 and the deep trench isolation structure DTI. Accordingly, a vertical level of a bottom surface of the contact barrier structure CA2 may be substantially the same as a vertical level of a bottom surface of the gate structure 103 constituting the source follower transistor 150.

Figure 9A:
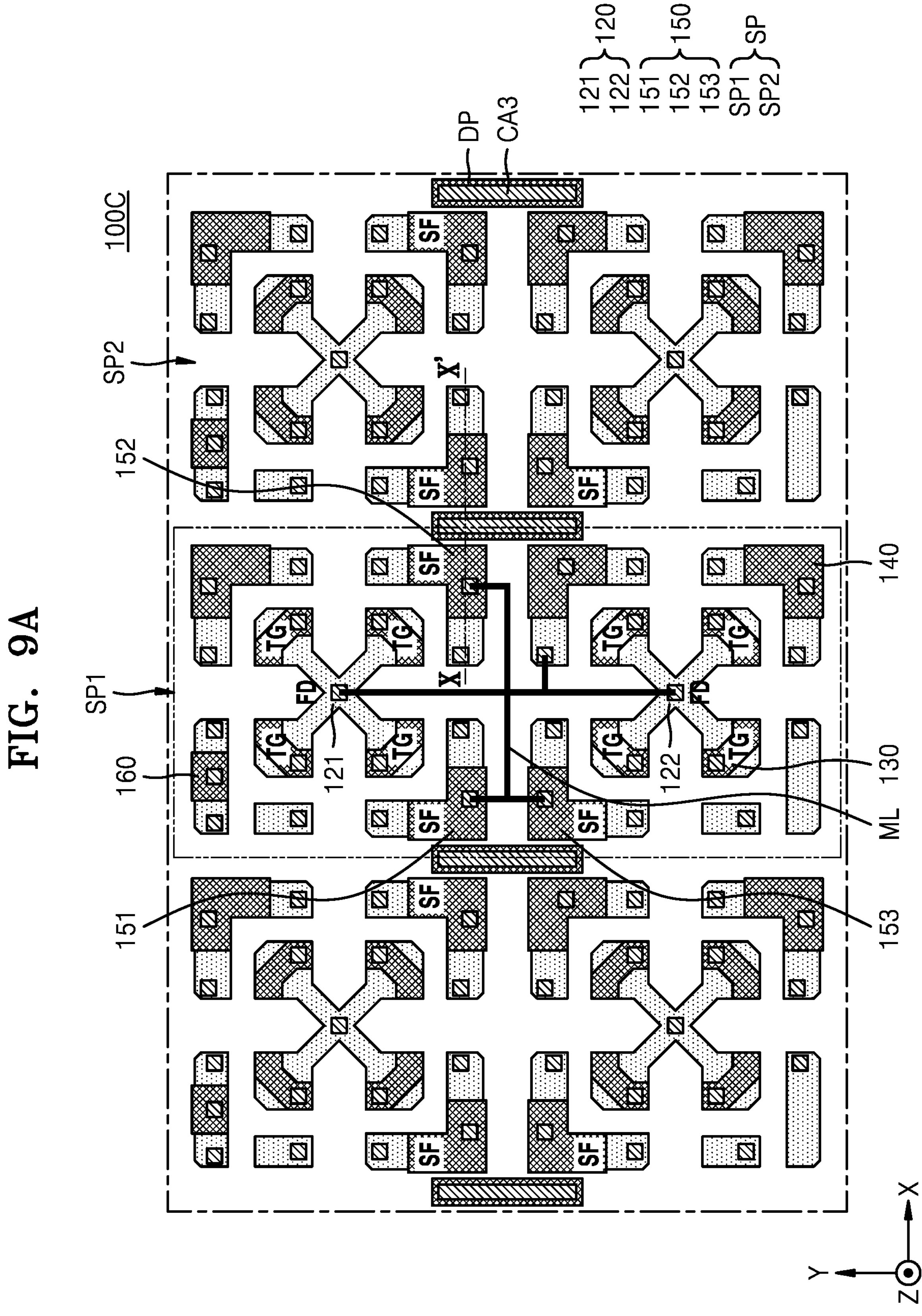
Figure 9B:
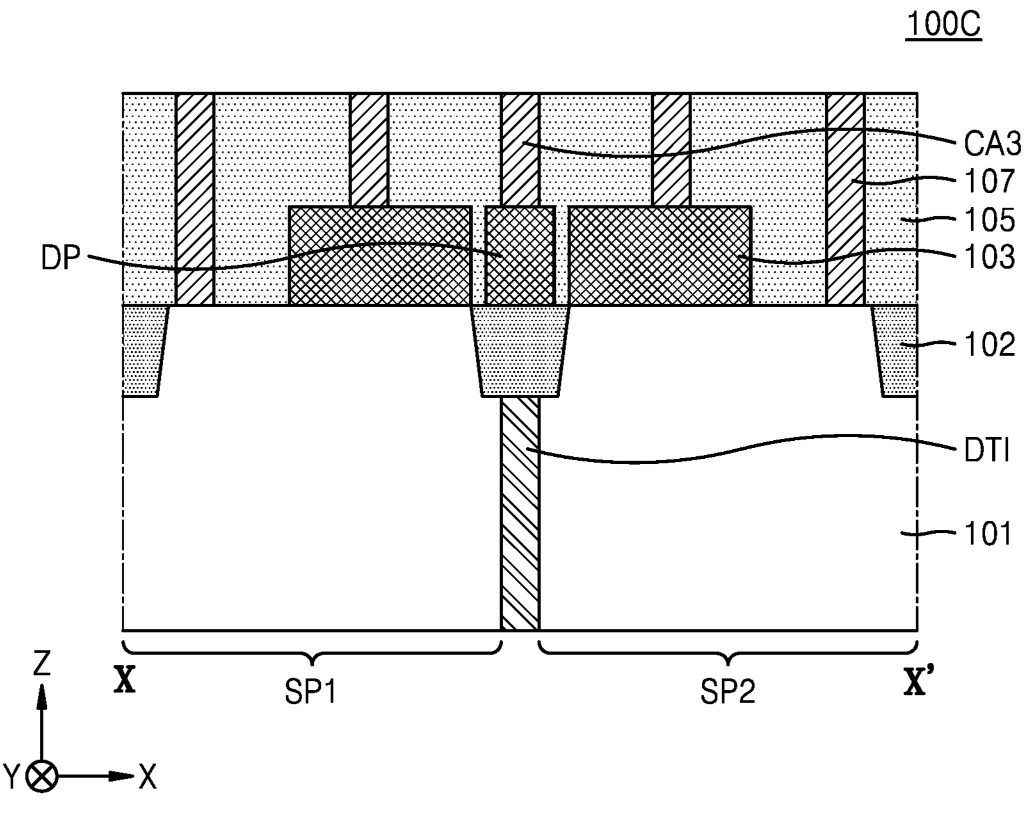

Referring to FIGS. 9A and 9B together, the image sensor 100C according to the present embodiment may include a plurality of shared pixels SP arranged on the substrate 101 in a two-dimensional array structure. The image sensor 100C of the present embodiment may include a contact barrier structure CA3 arranged between the plurality of shared pixels SP and overlapping the deep trench isolation structure DTI in the vertical direction (Z direction). When viewed from a plan perspective, the contact barrier structure CA3 may be arranged with a long axis in the second horizontal direction (Y direction), in a region where the second source follower transistor 152 of the first shared pixel SP1 and the first and third source follower transistors 151 and 153 of the second shared pixel SP2 face each other. And, when viewed in cross-section, the contact barrier structure CA3 may overlap the deep trench isolation structure DTI in the vertical direction (Z direction), but a polysilicon dummy structure DP may be arranged therebetween. In some embodiments, the polysilicon dummy structure DP may be a portion of a material constituting the gate structure 103. That is, the lower insulating layer 102 and the polysilicon dummy structure DP, which are different materials from each other, may be arranged between the contact barrier structure CA3 and the deep trench isolation structure DTI. Accordingly, a vertical level of a bottom surface of the contact barrier structure CA3 may be higher than a vertical level of a bottom surface of the gate structure 103 constituting the source follower transistor 150. Advantageously, because the contact barrier structure CA3 and the polysilicon dummy structure DP are electrically connected to each other to form one shielding film, parasitic capacitance between neighboring source follower gates SF may be effectively suppressed.

Figure 10:
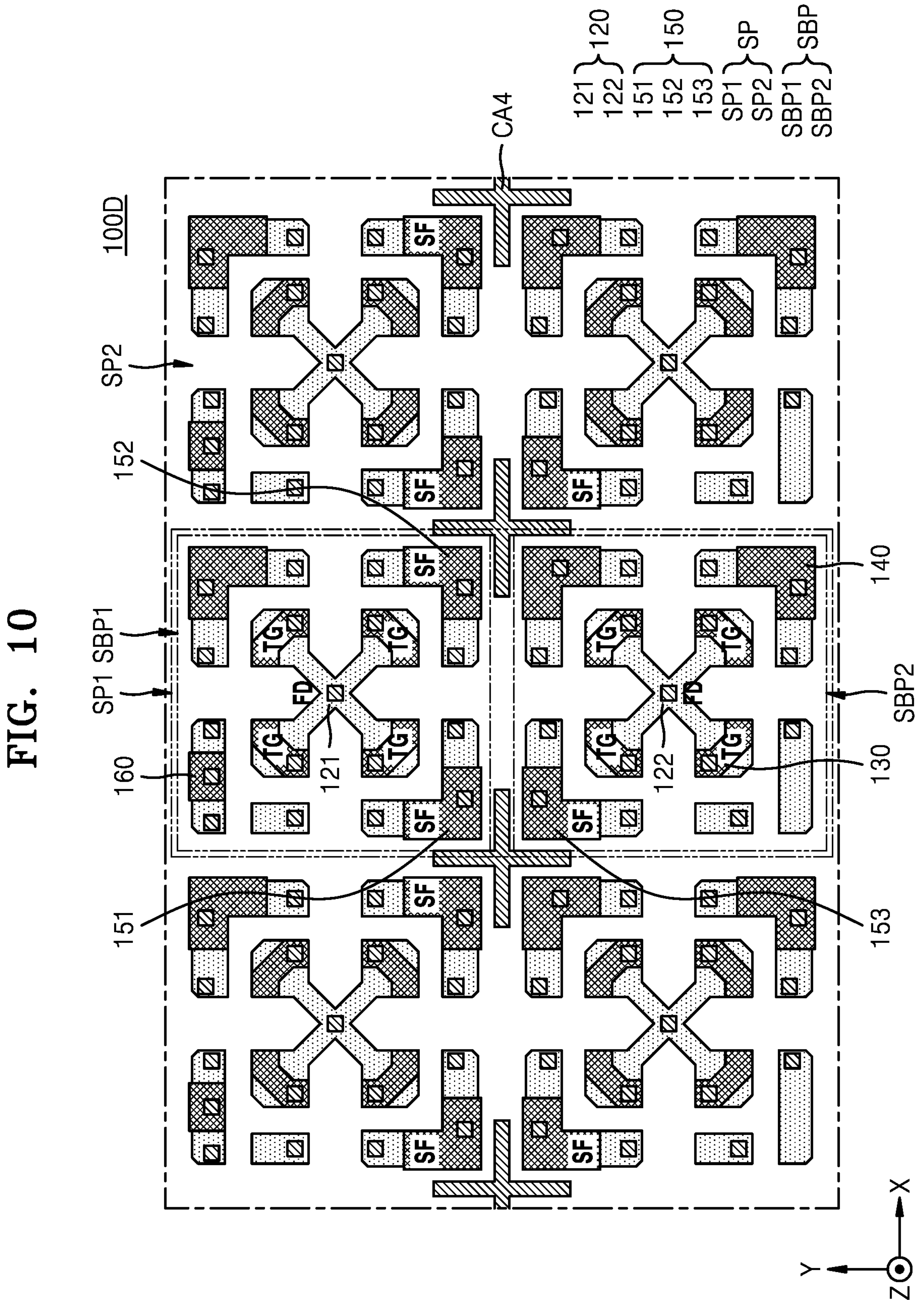
FIG. 10 is a plan layout view of shared pixels of an image sensor, according to another embodiment.

FIG. 10 is a plan layout of shared pixels of an image sensor, according to another embodiment. Referring to FIG. 10, an image sensor 100D according to the present embodiment may include a plurality of shared pixels SP arranged on the substrate 101 in a two-dimensional array structure. The image sensor 100D according to the present embodiment may include a contact barrier structure CA4 that is arranged between the plurality of shared pixels SP and between the plurality of sub-pixels SBP, and overlaps the deep trench isolation structure DTI in the vertical direction (Z direction).

In the image sensor 100D according to the present embodiment, the first sub-pixel SBP1 and the second sub-pixel SBP2 may not share the floating diffusion region 120 with each other. That is, the first floating diffusion region 121 of the first subpixel SBP1 and the second floating diffusion region 122 of the second subpixel SBP2 may not be connected to each other by a metal wiring layer. And, when viewed from a plan perspective, the contact barrier structure CA4 may be arranged in a cross shape in a region where the second source follower transistor 152 of the first shared pixel SP1 and the first and third source follower transistors 151 and 153 of the second shared pixel SP2 face each other and the first source follower transistor 151 of the first subpixel SBP1 and the third source follower transistor 153 of the second subpixel SBP2 face each other.

Figure 11:
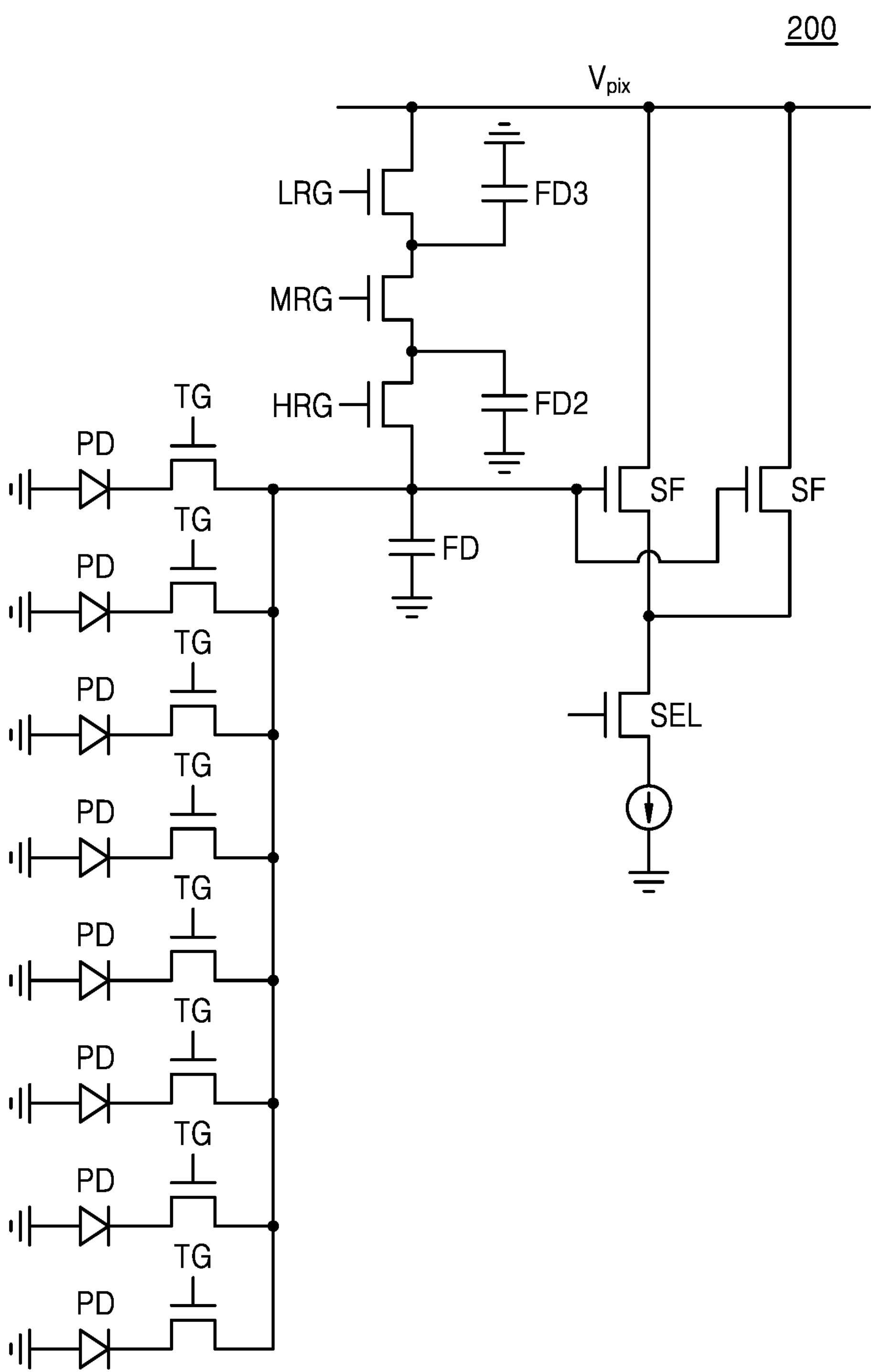
FIG. 11 is a circuit diagram of an example of a pixel unit included in an image sensor, according to an embodiment.
Figure 12A:
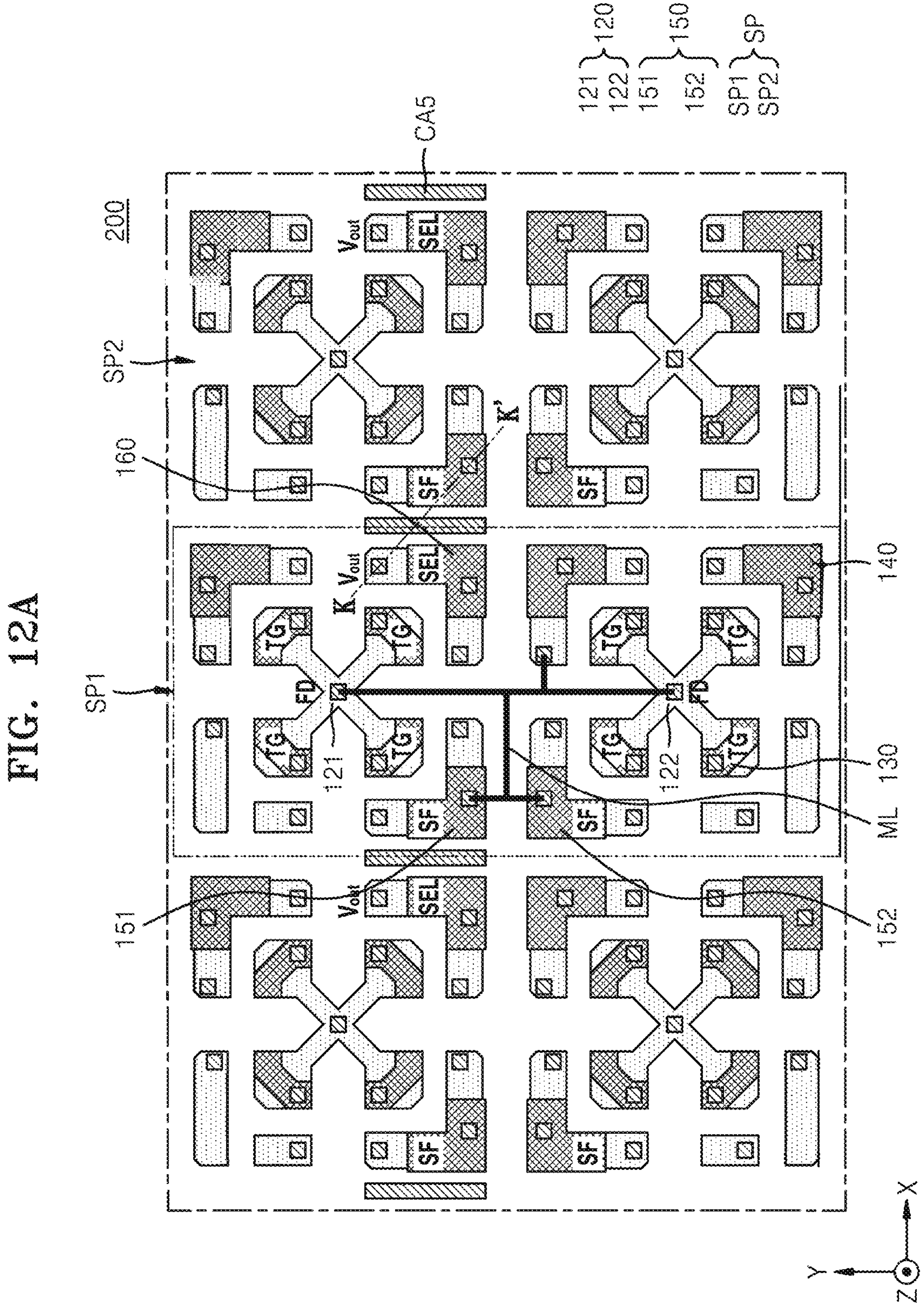
FIG. 12A is a plan layout view of shared pixels of an image sensor, according to an embodiment, corresponding to the circuit diagram of FIG. 11.
Figure 12B:
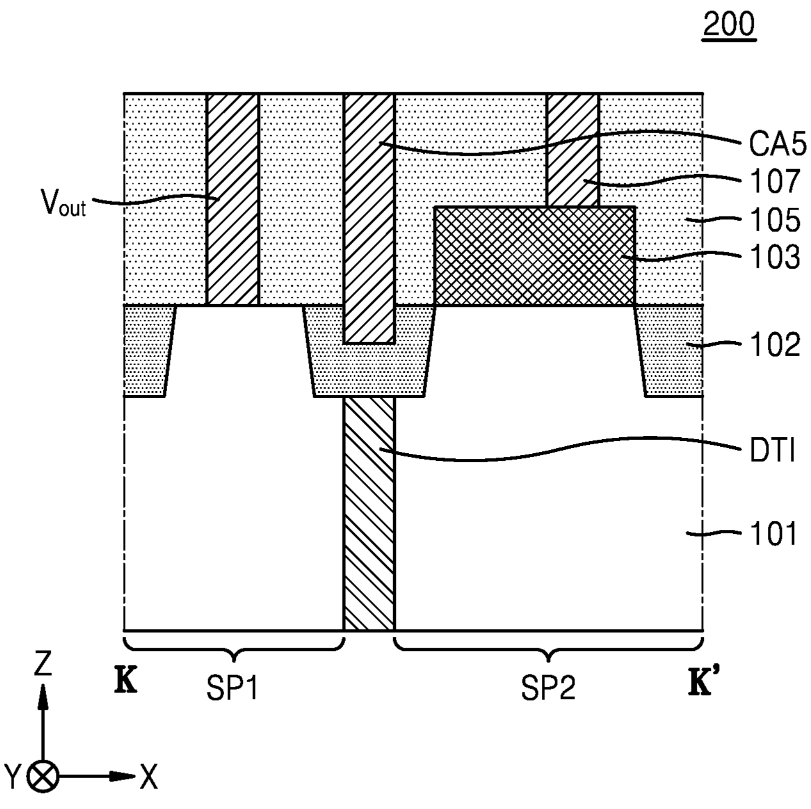
FIG. 12B is a cross-sectional view taken along line K-K' of FIG. 12A.

FIG. 11 is a circuit diagram of an example of a pixel unit included in an image sensor, according to an embodiment. FIG. 12A is a plan layout of shared pixels of an image sensor, according to an embodiment, corresponding to the circuit diagram of FIG. 11. FIG. 12B is a cross-sectional view taken along line K-K' of FIG. 12A. Referring to FIGS. 11 to 12B together, an image sensor 200 according to the present embodiment may include a plurality of shared pixels SP arranged on the substrate 101 in a two-dimensional array structure.

The shared pixel SP may include various types of pixel transistors 140, 150, and 160 for transferring signals corresponding to charges stored in the floating diffusion region 120. The various types of pixel transistors 140, 150, and 160 may include, for example, the reset transistor 140, the source follower transistor 150, and the selection transistor 160. For example, the source follower gate SF of the source follower transistor 150 and the selection gate SEL of the selection transistor 160 are illustrated in the drawings. The source follower gate SF and heavily doped regions formed on both sides of the source follower gate SF may constitute the source follower transistor 150. Also, the selection gate SEL and heavily doped regions formed on both sides of the source follower gate SF may constitute the selection transistor 160. Here, an output voltage line $V_{out}$ may be connected to one end of the selection gate SEL.

The image sensor 100B according to the present embodiment may include a contact barrier structure CA5 arranged between the plurality of shared pixels SP and overlapping the deep trench isolation structure DTI in the vertical direction (Z direction). Among the plurality of shared pixels SP, shared pixels SP arranged adjacent to each other along the first horizontal direction (X direction) are referred to as the first and second shared pixels SP1 and SP2 for convenience of description. That is, in the drawing, a shared pixel SP located in a center is referred to as the first shared pixel SP1, and a shared pixel SP located to the right of the first shared pixel SP1 is referred to as the second shared pixel SP2.

In detail, the first and second shared pixels SP1 and SP2 may include the first and second floating diffusion regions 121 and 122 arranged at different positions from each other, respectively. In addition, the first and second shared pixels SP1 and SP2 may be electrically connected to the plurality of floating diffusion regions 121 and 122, respectively, and include the first and second source follower transistors 151 and 152 arranged at different positions.

In some embodiments, the first source follower transistor 151 and the selection transistor 160 may be located in the first sub-pixel SBP1, and the second source follower transistor 152 may be located in the second sub-pixel SBP2. For example, the first source follower transistor 151 and the selection transistor 160 may face each other in the first horizontal direction (X direction) and be arranged at both ends in the first horizontal direction (X direction), and the first and second source follower transistors 151 and 152 may face each other in the second horizontal direction (Y direction) and be arranged at one ends in the first horizontal direction (X direction).

When viewed from a plan perspective, the contact barrier structure CA5 may be arranged with a long axis in the second horizontal direction (Y direction), in a region where the selection transistor 160 and the output voltage line $V_{out}$ of the first shared pixel SP1 and the first source follower transistor 151 of the second shared pixel SP2 face each other. And, when viewed in cross-section, the contact barrier structure CA5 may overlap the deep trench isolation structure DTI in the vertical direction (Z direction), but be spaced apart from each other. The lower insulating layer 102, which is an insulation material layer, may be arranged between the contact barrier structure CA5 and the deep trench isolation structure DTI. A vertical level of a bottom surface of the contact barrier structure CA may be lower than a vertical level of a bottom surface of the gate structure 103 constituting the source follower transistor 150.

The first and second source follower transistors 151 and 152 and the selection transistor 160 may each include the vertical contact 107 electrically connected thereto, and the vertical contact 107 may be surrounded by the upper insulating layer 105. That is, the contact barrier structure CA5 and the vertical contact 107 may include substantially the same material and be formed in substantially the same process.

The contact barrier structure CA5 may include, for example, a conductive metal material such as copper (Cu), aluminum (Al), or tungsten (W). The contact barrier structure CA including a conductive metal material as described above may be electrically connected to a DC voltage line (not shown). Accordingly, the contact barrier structure CA5 may advantageously suppress coupling between the output voltage line $V_{out}$ and the source follower gate SF that are adjacent to each other.

Figure 13:
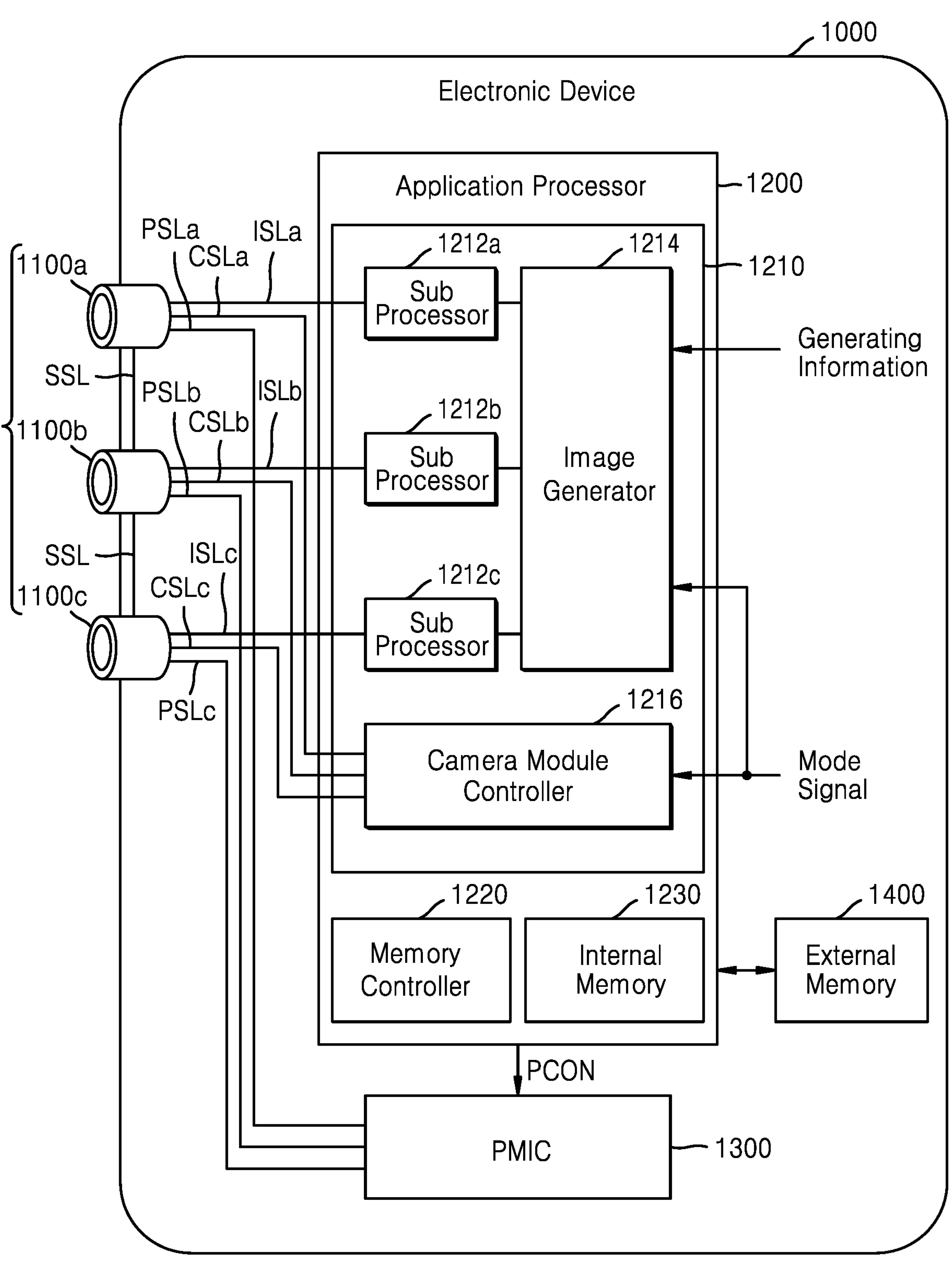
FIG. 13 is a block diagram of an electronic device including a multi-camera module.
Figure 14:
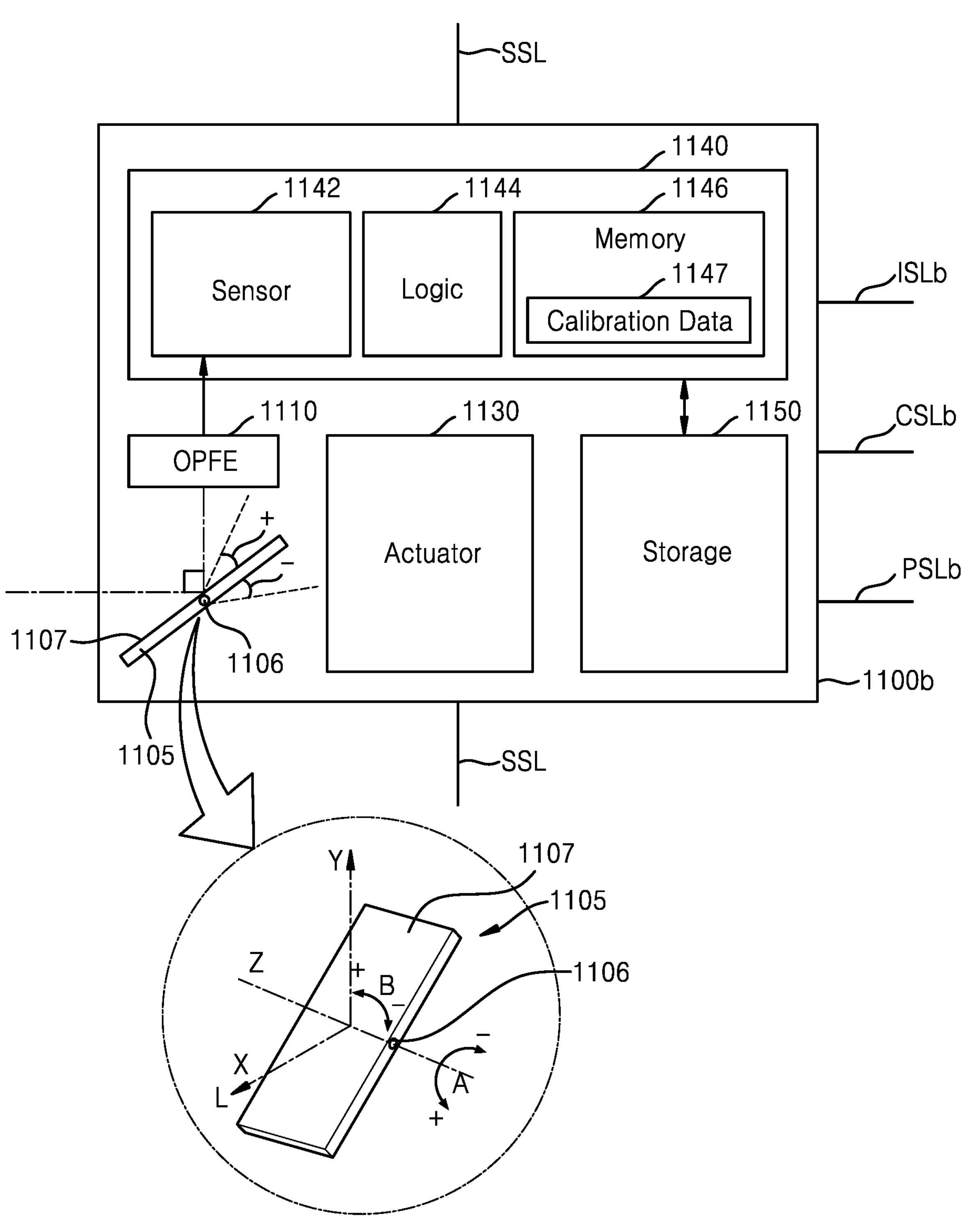
FIG. 14 is a detailed block diagram of a camera module of FIG. 13.

FIG. 13 is a block diagram of an electronic device including a multi-camera module, and FIG. 14 is a detailed block diagram of a camera module of FIG. 13. Referring to FIG. 13, an electronic device 1000 may include a camera module group 1100, an application processor 1200, a power management integrated circuit (PMIC) 1300, and an external memory 1400. The camera module group 1100 may include a plurality of camera modules **1100*a*, 1100*b*, and 1100*c*. While three camera modules 1100*a*, 1100*b*, and 1100*c* are illustrated in FIG. 13, the embodiments are not limited thereto. In some embodiments, the camera module group 1100** may include only two camera modules or may be modified to include n camera modules (where n is a natural number equal to or greater than 4).

Referring to FIG. 14, the camera module **1100*b* may include a prism 1105, an optical path folding element (OPFE) 1110, an actuator 1130, an image sensing device 1140, and a storage 1150. Here, a detailed configuration of one camera module 1100*b* will be described in more detail, but the following description may be equally applied to other camera modules 1100*a* and 1100*c* according to embodiments. The prism 1105 may include a reflective surface 1107** of a light reflective material to change a path of light L incident from the outside.

In some embodiments, the prism 1105 may change the path of light L incident in the first direction (X direction), into the second direction (Y direction) perpendicular to the first direction (X direction). In addition, the prism 1105 may change the path of light L incident in the first direction (X direction), into the second direction (Y direction) perpendicular to the first direction (X direction), by rotating the reflective surface 1107 of the light reflective material around the central axis 1106 in an A-direction or rotating the central axis 1106 in a B-direction. In this case, the OPFE 1110 may also move in the first direction (X direction), the second direction (Y direction), and the third direction (Z direction).

In some embodiments, as illustrated in the drawings, a maximum angle of rotation of the prism 1105 in direction A may be equal to or less than 15° in a positive (+) A-direction and greater than 15° in a negative (−) A-direction, but the embodiments are not limited thereto. In some embodiments, the prism 1105 may move by about 20° in the positive (+) or negative (−) B direction, or between 10° and 20°, or between 15° and 20°, where the angle at which the prism 1105 move may be shifted at the same angle in the positive (+) or negative (−) B-direction, or may be shifted to an almost similar angle within a range of 1°. In some embodiments, the prism 1105 may move the reflective surface 1107 of the light reflective material in the third direction (Z direction) parallel to the extending direction of the central axis 1106.

The OPFE 1110 may include, for example, optical lenses composed of m groups (where m is a natural number). The m lenses may move in the second direction (Y direction) to change an optical zoom ratio of the camera module **1100*b*. For example, when a basic optical zoom ratio of the camera module 1100*b* is Z, and when m optical lenses included in the OPFE 1110 are moved, the optical zoom ratio of the camera module 1100*b*** may be changed to 3Z, 5Z, or an optical zoom ratio of 5Z or higher.

The actuator 1130 may move the OPFE 1110 or an optical lens to a certain position. For example, for accurate sensing, the actuator 1130 may adjust a position of the optical lens such that the image sensor 1142 is positioned at a focal length of the optical lens. The image sensing device 1140 may include an image sensor 1142, a control logic 1144, and a memory 1146. The image sensor 1142 may sense an image of a sensing target by using the light L provided through the optical lens. The control logic 1144 may control the overall operation of the camera module **1100*b*. For example, the control logic 1144 may control the operation of the camera module 1100*b*** according to a control signal provided through a control signal line CSLb.

The memory 1146 may store information required for operation of the camera module **1100*b*, such as calibration data 1147. The calibration data 1147 may include information necessary for the camera module 1100*b* to generate image data by using the light L provided from the outside. The calibration data 1147 may include, for example, information about a degree of rotation, information about a focal length, information about an optical axis, and the like, as described above. When the camera module 1100*b* is implemented in the form of a multi-state camera in which the focal length changes according to a position of an optical lens, the calibration data 1147** may include information related to a focal distance value for each position (or each state) of the optical lens.

The storage 1150 may store image data sensed through the image sensor 1142. The storage 1150 may be arranged outside the image sensing device 1140 and may be implemented in a stacked form with a sensor chip constituting the image sensing device 1140. In some embodiments, the storage 1150 may be implemented as an electrically erasable programmable read-only memory (EEPROM), but the embodiments are not limited thereto.

Referring to FIGS. 13 and 14 together, in some embodiments, each of the plurality of camera modules **1100*a*, 1100*b*, and 1100*c* may include the actuator 1130. Accordingly, each of the plurality of camera modules 1100*a*, 1100*b*, and 1100*c* may include the same or different calibration data 1147 according to the operation of the actuator 1130 included therein. In some embodiments, one camera module (for example, 1100*b*) among the plurality of camera modules 1100*a*, 1100*b*, 1100*c*, may be a folded lens-type camera module including the prism 1105 and the OPFE 1110 described above, and the remaining camera modules (for example, 1100*a*, 1100*c*) may be a vertical type camera module that does not include the prism 1105 and the OPFE 1110**, but the inventive concept is not limited thereto.

In some embodiments, one camera module (for example, **1100*c*) among the plurality of camera modules 1100*a*, 1100*b*, and 1100*c* may include a vertical-type depth camera that extracts depth information by using, for example, infrared ray (IR) depth information. In this case, the application processor 1200 may generate a 3D depth image by merging image data provided from the depth camera and image data provided from other camera modules (for example, 1100***a* or 1100*b*).

In some embodiments, at least two camera modules (for example, 1100*a*, 1100*b*) among the plurality of camera modules 1100*a*, 1100*b*, and 1100*c* may have different views of observation (field of view) from each other. In this case, for example, optical lenses of at least two camera modules (for example, 1100*a*, 1100*b*) among the plurality of camera modules 1100*a*, 1100*b*, and 1100*c* may be different from each other, but the inventive concept is not limited thereto. Also, in some embodiments, each of the plurality of camera modules 1100*a*, 1100*b*, and 1100*c* may have different fields of view from each other. In this case, optical lenses included in each of the plurality of camera modules 1100*a*, 1100*b*, and 1100*c* may also be different from each other, but are not limited thereto. In some embodiments, each of the plurality of camera modules 1100*a*, 1100*b*, and 1100*c* may be arranged physically apart from each other. That is, a sensing area of one image sensor 1142 is not divided to be separately used by the plurality of camera modules 1100*a*, 1100*b*, and 1100*c*, but an independent image sensor 1142 may be arranged inside each of the plurality of camera modules 1100*a*, 1100*b*, and 1100*c*.

Referring back to FIG. 13, the application processor 1200 may include an image processing device 1210, a memory controller 1220, and an internal memory 1230. The application processor 1200 may be implemented separately from the plurality of camera modules 1100*a*, 1100*b*, and 1100*c*. For example, the application processor 1200 and the plurality of camera modules 1100*a*, 1100*b*, and 1100*c* may be separately implemented as separate semiconductor chips. The image processing device 1210 may include a plurality of sub image processors 1212*a*, 1212*b*, and 1212*c*, an image generator 1214, and a camera module controller 1216.

The image processing device 1210 may include a plurality of sub-image processors 1212*a*, 1212*b*, and 1212*c* corresponding to the number of the plurality of camera modules 1100*a*, 1100*b*, and 1100*c*. Image data generated from each of the camera modules 1100*a*, 1100*b*, and 1100*c* may be provided to the corresponding sub-image processors 1212*a*, 1212*b*, and 1212*c* through separate image signal lines ISLa, ISLb, and ISLc. For example, image data generated from the camera module 1100*a* may be provided to the sub-image processor 1212*a* through the image signal line ISLa, and image data generated from the camera module 1100*b* may be provided to the sub-image processor 1212*b* through the image signal line ISLb, and image data generated from the camera module 1100*c* may be provided to the sub-image processor 1212*c* through the image signal line ISLc. Transmission of image data as described above may be performed using, for example, a Camera Serial Interface (CSI) based on Mobile Industry Processor Interface (MIPI), but the inventive concept is not limited thereto.

In some embodiments, one sub-image processor may be arranged to correspond to a plurality of camera modules. For example, the sub-image processor 1212*a* and the sub-image processor 1212*c* may not be separately implemented as shown, but integrated into one sub-image processor, and image data provided by the camera module 1100*a* and the camera module 1100*c* may be selected through a selection element (for example, multiplexer) and the like, and then provided to the integrated sub-image processor.

Image data provided to each of the sub-image processors 1212*a*, 1212*b*, and 1212*c* may be provided to the image generator 1214. The image generator 1214 may generate an output image by using image data provided from each of the sub-image processors 1212*a*, 1212*b*, and 1212*c* according to image generating information or a mode signal. In detail, the image generator 1214 may merge at least some pieces of the image data generated from the camera modules 1100*a*, 1100*b*, and 1100*c* having different fields of view from each other, according to image generation information or a mode signal to generate an output image. Also, the image generator 1214 may generate an output image by selecting any one of pieces of image data generated by the camera modules 1100*a*, 1100*b*, and 1100*c* having different fields of view from each other, according to image generation information or a mode signal.

In some embodiments, the image generation information may include a zoom signal or a zoom factor. Also, in some embodiments, the mode signal may be a signal based on a mode selected by a user, for example. When the image generation information is a zoom signal (zoom factor), and each of the camera modules 1100*a*, 1100*b*, and 1100*c* has a different view of observation (field of view) from one another, the image generator 1214 may perform different operations according to the type of the zoom signal. For example, when the zoom signal is a first signal, after merging image data output from the camera module 1100*a* with image data output from the camera module 1100*c*, an output image may be generated using the merged pieces of image data and image data output from the camera module 1100*b*, which is not used in the merging. If the zoom signal is a second signal different from the first signal, the image generator 1214 does not perform image merging as above, and may generate an output image by selecting any one piece of the image data output from each of the camera modules 1100*a*, 1100*b*, and 1100*c*. However, the inventive concept is not limited thereto, and a method of processing image data may be modified and implemented as needed.

In some embodiments, the image generator 1214 may receive a plurality of pieces of image data having different exposure times from at least one of the plurality of sub-image processors 1212*a*, 1212*b*, and 1212*c*, and performs high dynamic range (HDR) processing on the plurality of pieces of image data to generate merged image data with an increased dynamic range. The camera module controller 1216 may provide a control signal to each of the camera modules 1100*a*, 1100*b*, and 1100*c*. Control signals generated by the camera module controller 1216 may be provided to corresponding camera modules 1100*a*, 1100*b*, and 1100*c* through separate control signal lines CSLa, CSLb, and CSLc.

One of the plurality of camera modules 1100*a*, 1100*b*, and 1100*c* is designated as a master camera module (for example, 1100*b*) according to image generation information including a zoom signal or a mode signal, and the remaining cameras modules (for example, 1100*a* and 1100*c*) may be designated as slave cameras. Such information may be included in a control signal and provided to corresponding camera modules 1100*a*, 1100*b*, and 1100*c* through the separate control signal lines CSLa, CSLb, and CSLc.

Camera modules operating as a master and a slave may be changed according to a zoom factor or an operation mode signal. For example, when a field of view of the camera module 1100*a* is wider than that of the camera module 1100*b* and the zoom factor indicates a low zoom ratio, the camera module 1100*b* may operate as a master and the camera module 1100*a* may operate as a slave. In contrast, when the zoom factor indicates a high zoom ratio, the camera module 1100*a* may operate as a master and the camera module 1100*b* may operate as a slave.

In some embodiments, a control signal provided from the camera module controller 1216 to each of the camera modules 1100*a*, 1100*b*, and 1100*c* may include a sync enable signal. For example, when the camera module 1100*b* is a master camera and the camera modules 1100*a* and 1100*c* are slave cameras, the camera module controller 1216 may transmit a sync enable signal to the camera module 1100*b*. The camera module 1100*b* receiving such a sync enable signal may generate a sync signal based on the provided sync enable signal, and transmit the generated sync signal to the camera modules 1100*a* and 1100*c* through a sync signal line SSL. The camera module 1100*b* and the camera modules 1100*a* and 1100*c* may transmit image data to the application processor 1200 in synchronization with the sync signal.

In some embodiments, a control signal provided from the camera module controller 1216 to the plurality of camera modules 1100*a*, 1100*b*, and 1100*c* may include mode information according to a mode signal. The plurality of camera modules 1100*a*, 1100*b*, and 1100*c* may operate, based on the mode information, in a first operation mode or a second operation mode in relation to sensing speed. The plurality of camera modules 1100*a*, 1100*b*, and 1100*c* may generate an image signal at a first rate in the first operation mode (for example, generate an image signal at a first frame rate), and encode the image signal at a second rate higher than the first rate (for example, encode an image signal having a second frame rate higher than the first frame rate), and transmit the encoded image signal to the application processor 1200.

The application processor 1200 may store the received image signal, that is, the encoded image signal, in the internal memory 1230 or the external storage 1400 outside the application processor 1200, and then read and decode the encoded image signal from the internal memory 1230 or the external storage 1400, and display image data generated based on the decoded image signal. For example, a corresponding sub-processor among a plurality of sub-image processors 1212*a*, 1212*b*, and 1212*c* of the image processing device 1210 may perform decoding and may also perform image processing on the decoded image signal.

The plurality of camera modules 1100*a*, 1100*b*, and 1100*c* may generate an image signal at a third rate lower than the first rate in the second operation mode (for example, generate an image signal at a third frame rate lower than the first frame rate), and transmit the image signal to the application processor 1200. The image signal provided to the application processor 1200 may be an unencoded signal. The application processor 1200 may perform image processing on a received image signal or store the image signal in the internal memory 1230 or the external storage 1400.

The PMIC 1300 may supply power, for example, a power supply voltage, to each of the plurality of camera modules 1100*a*, 1100*b*, and 1100*c*. For example, the PMIC 1300 may supply, under the control of the application processor 1200, first power to the camera module 1100*a* through the power signal line PSLa, second power to the camera module 1100*b* through the power signal line PSLb, and third power to the camera module 1100*c* through the power signal line PSLc.

The PMIC 1300 may generate power corresponding to each of the plurality of camera modules 1100*a*, 1100*b*, and 1100*c* in response to a power control signal PCON from the application processor 1200, and also adjust a power level. The power control signal PCON may include a power control signal for each operation mode of the plurality of camera modules 1100*a*, 1100*b*, and 1100*c*. For example, the operation mode may include a low power mode, and in this case, the power control signal PCON may include information about a camera module operating in the low power mode and a set power level. Levels of the powers provided to each of the plurality of camera modules 1100*a*, 1100*b*, and 1100*c* may be the same or different from each other. Also, the level of power may be dynamically changed.

Figure 15:
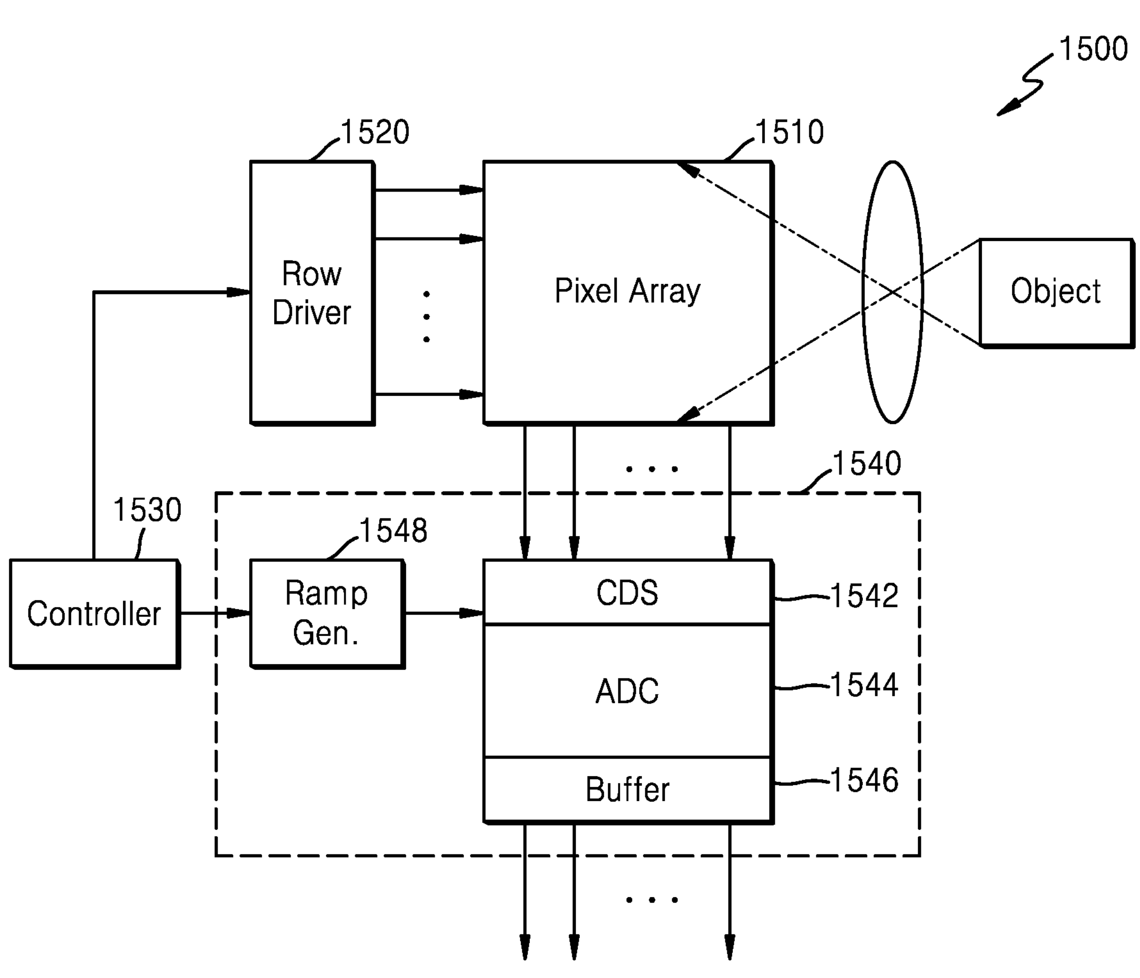
FIG. 15 is a block diagram illustrating a configuration of an image sensor according to embodiments.

FIG. 15 is a block diagram illustrating a configuration of an image sensor according to embodiments. Referring to FIG. 15, an image sensor 1500 may include a pixel array 1510, a controller 1530, a row driver 1520, and a pixel signal processor 1540. The image sensor 1500 may include at least one of the image sensors 100A, 100B, 100C, and 200 described above. The pixel array 1510 may include a plurality of unit pixels that are two-dimensionally arranged, and each unit pixel may include a photoelectric conversion element. The photoelectric conversion element may absorb light to generate photocharges, and an electrical signal (output voltage) according to the generated photocharges may be provided to the pixel signal processor 1540 through a vertical signal line.

Unit pixels included in the pixel array 1510 may provide an output voltage each time in units of rows, and accordingly, unit pixels belonging to one row of the pixel array 1510 may be simultaneously activated by a selection signal output by the row driver 1520. A unit pixel belonging to the selected row may provide an output voltage according to absorbed light to an output line of a corresponding column.

The controller 1530 may control the row driver 1520 such that the pixel array 1510 absorbs light to accumulate photocharges or temporarily stores the accumulated photocharges, and an electrical signal according to the stored photocharges is transmitted to the outside of the pixel array 1510. Also, the controller 1530 may control the pixel signal processor 1540 to measure an output voltage provided by the pixel array 1510. The pixel signal processor 1540 may include a correlated double sampler 1542, an analog-to-digital converter 1544, and a buffer 1546. The correlated double sampler 1542 may sample and hold the output voltage provided by the pixel array 1510.

The correlated double sampler 1542 may double-sample a level according to a specific noise level and the generated output voltage, and output a level corresponding to the difference therebetween. In addition, the correlated double sampler 1542 may receive ramp signals generated by the ramp signal generator 1548, compare the ramp signals with each other, and output a comparison result.

The analog-to-digital converter 1544 may convert an analog signal corresponding to a level received from the correlated double sampler 1542, into a digital signal. The buffer 1546 may latch a digital signal, and the latched signal may be sequentially output to the outside of the image sensor 1500 and transferred to an image processor (not shown).

While the inventive concept has been particularly shown and described with reference to embodiments thereof, it will be understood by those of ordinary skill in the art that various changes in form and details may be made therein without departing from the spirit and scope of the inventive concept as defined by the appended claims. The embodiments should be considered in a descriptive sense only and not for purposes of limitation.

What is claimed is:

1. An image sensor, comprising:

a substrate;

first and second shared pixels, which extend adjacent to each other in a first direction across the substrate, and respectively include:

a plurality of floating diffusion regions at spaced apart locations within the substrate; and a plurality of spaced-apart source follower gates electrically connected to the plurality of floating diffusion regions;

a deep trench isolation structure, which extends within the substrate and at least partially partitions the first and second shared pixels from each other; and a contact barrier structure, which extends on the substrate, vertically overlaps the deep trench isolation structure, at least partially partitions the first and second shared pixels from each other, and is arranged with a long axis in a second direction orthogonal to the first direction and between one of the plurality of source follower gates of the first shared pixel and one of the plurality of source follower gates of the second shared pixel.

2. The image sensor of claim 1, wherein the plurality of source follower gates include first to third source follower gates; wherein the first and second source follower gates face each other in the first direction and are arranged at both ends in the first direction; and wherein the first and third source follower gates face each other in the second direction and are arranged at one end in the first direction.

3. The image sensor of claim 2, wherein the contact barrier structure is arranged between a second source follower gate of the first shared pixel and first and third source follower gates of the second shared pixel.

4. The image sensor of claim 1, wherein the plurality of floating diffusion regions include first and second floating diffusion regions, which are spaced apart relative to each other; and wherein each of the first and second floating diffusion regions is shared by a plurality of transfer gates.

5. The image sensor of claim 4, wherein the first and second floating diffusion regions are arranged while facing each other in the second direction, and are located in a center area of the plurality of transfer gates.

6. The image sensor of claim 1, further comprising a vertical contact electrically connected to the plurality of source follower gates, said vertical contact including substantially the same material as the contact barrier structure.

7. The image sensor of claim 1, wherein the deep trench isolation structure and the contact barrier structure are spaced apart from each other in a vertical direction.

8. The image sensor of claim 7, wherein an insulation material layer is arranged between the deep trench isolation structure and the contact barrier structure; and wherein a vertical level of a bottom surface of the contact barrier structure is lower than a vertical level of bottom surfaces of the plurality of source follower gates.

9. The image sensor of claim 7, wherein an insulation material layer and a silicon material layer are arranged between the deep trench isolation structure and the contact barrier structure; and wherein a vertical level of a bottom surface of the contact barrier structure is substantially the same as a vertical level of bottom surfaces of the plurality of source follower gates.

10. The image sensor of claim 7, wherein an insulation material layer and a polysilicon material layer are arranged between the deep trench isolation structure and the contact barrier structure; and wherein a vertical level of a bottom surface of the contact barrier structure is higher than a vertical level of bottom surfaces of the plurality of source follower gates.

11. An image sensor, comprising:

a substrate;

a first shared pixel including first and second floating diffusion regions in the substrate, first and second source follower gates, a selection gate;

a second shared pixel including first and second floating diffusion regions in the substrate, first and second source follower gates, and a selection gate;

a deep trench isolation structure extending in the substrate, and at least partially partitioning the first shared pixel from the second shared pixel; and a contact barrier structure, which at least partially overlaps the deep trench isolation structure in a vertical direction, and extends between the first and second shared pixels;

wherein each of the first and second shared pixels includes a plurality of unit pixels; and wherein, in each of the first and second shared pixels, the first and second source follower gates are arranged at one end in a first horizontal direction and face each other in a second horizontal direction perpendicular to the first horizontal direction, and the selection gate is arranged at another end in the first horizontal direction and faces the first source follower gate in the first horizontal direction.

12. The image sensor of claim 11, further comprising:

an output voltage line arranged at one end of the selection gate within the first shared pixel;

wherein the first and second shared pixels are arranged adjacent to each other in the first horizontal direction; and wherein the contact barrier structure is arranged with a long axis in the second horizontal direction, between the output voltage line and the selection gate of the first shared pixel and the first source follower gate of the second shared pixel.

13. The image sensor of claim 12, wherein one sidewall of the contact barrier structure faces the output voltage line and the selection gate of the first shared pixel; and wherein another sidewall of the contact barrier structure faces the first source follower gate of the second shared pixel.

14. The image sensor of claim 11, wherein the first and second floating diffusion regions and the first and second source follower gates are all electrically connected to each other via a metal wiring layer.

15. The image sensor of claim 11, wherein an insulation material layer is arranged between the deep trench isolation structure and the contact barrier structure; and wherein the deep trench isolation structure and the contact barrier structure are spaced apart from each other in the vertical direction.

16. An image sensor, comprising:

a substrate;

a first shared pixel including a first sub-pixel having four first unit pixels therein that share a first floating diffusion region, a second sub-pixel having four second unit pixels therein that share a second floating diffusion region, and first, second and third source follower gates;

a second shared pixel extending adjacent to the first shared pixel in a first horizontal direction, said second shared pixel including a first sub-pixel having four first unit pixels therein that share a first floating diffusion region, a second sub-pixel having four second unit pixels therein that share a second floating diffusion region, and first, second and third source follower gates;

first and second transfer gates arranged on the substrate and respectively corresponding to the first and second unit pixels;

a deep trench isolation structure that extends within the substrate and at least partially partitions the first shared pixel from the second shared pixel; and a contact barrier structure having a long axis in a second horizontal direction perpendicular to the first horizontal direction, extending between the first and second shared pixels, and overlapping the deep trench isolation structure in a vertical direction; and wherein, in each of the first and second shared pixels, the first and second source follower gates face each other in the first horizontal direction and are arranged at both ends in the first horizontal direction, and the first and third source follower gates face each other in the second horizontal direction and are arranged at one ends in the first horizontal direction.

17. The image sensor of claim 16, wherein the first and second source follower gates are arranged in the first sub-pixel; wherein the third source follower gate is arranged in the second sub-pixel; and wherein the first and second floating diffusion regions and the first to third source follower gates are all electrically connected to each other via a metal wiring layer.

18. The image sensor of claim 17, wherein the contact barrier structure is arranged between a second source follower gate of the first shared pixel and first and third source follower gates of the second shared pixel.

19. The image sensor of claim 17, wherein an insulation material layer is arranged between the deep trench isolation structure and the contact barrier structure;

wherein the deep trench isolation structure and the contact barrier structure are spaced apart from each other in the vertical direction; and wherein a vertical level of a bottom surface of the contact barrier structure is lower than a vertical level of bottom surfaces of the first to third source follower gates.

20. The image sensor of claim 19, wherein the contact barrier structure penetrates into a portion of the insulation material layer.

* * * * *